(12) United States Patent
Ogawa et al.

(10) Patent No.: US 6,723,165 B2
(45) Date of Patent: Apr. 20, 2004

(54) METHOD FOR FABRICATING GROUP III NITRIDE SEMICONDUCTOR SUBSTRATE

(75) Inventors: Masahiro Ogawa, Higashiosaka (JP); Masahiro Ishida, Hirakata (JP); Satoshi Tamura, Takaraduka (JP); Shinichi Takigawa, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 138 days.

(21) Appl. No.: 10/118,924

(22) Filed: Apr. 10, 2002

(65) Prior Publication Data

US 2002/0182839 A1 Dec. 5, 2002

(30) Foreign Application Priority Data

| Apr. 13, 2001 | (JP) | 2001-115039 |
| Apr. 13, 2001 | (JP) | 2001-115040 |
| May 18, 2001 | (JP) | 2001-149096 |

(51) Int. Cl.⁷ .......................... C30B 25/02; C30B 25/04
(52) U.S. Cl. ..................... 117/95; 117/89; 117/90; 117/92; 117/103
(58) Field of Search .................. 117/89, 90, 92, 117/94, 95, 103; 438/46, 458

(56) References Cited

U.S. PATENT DOCUMENTS 6,071,795 A  6/2000  Cheung et al.
6,210,479 B1  4/2001  Bojarczuk et al.

FOREIGN PATENT DOCUMENTS

| JP | 2000-252224 | 9/2000 |
| JP | 2001-501778 | 2/2001 |

OTHER PUBLICATIONS

English Abstract of PCT International Publication WO98/14986.

Michael K. Kelly et al., "Large Free–Standing GaN Substrats by Hydride Vapor Phase Epitaxy and Laser–Induced Liftoff", Japanese Journal of Applied Physics, vol. 38, pp. 217–219, Mar. 1999.

*Primary Examiner*—Elizabeth D. Wood
(74) *Attorney, Agent, or Firm*—McDermott, Will & Emery

(57) ABSTRACT

A method for fabricating a Group III nitride semiconductor substrate according to the present invention includes the steps of: (a) preparing a substrate; (b) forming, on the substrate, a first semiconductor layer composed of a Group III nitride semiconductor; (c) forming, on the first semiconductor layer, a heat diffusion suppressing layer lower in thermal conductivity than the first semiconductor layer; (d) forming, on the heat diffusion suppressing layer, a second semiconductor layer composed of a Group III nitride semiconductor; and (e) irradiating the first semiconductor layer through the substrate with a light beam transmitted by the substrate and absorbed by the first semiconductor layer to decompose the first semiconductor layer.

22 Claims, 11 Drawing Sheets

METHOD FOR FABRICATING GROUP III NITRIDE SEMICONDUCTOR SUBSTRATE

BACKGROUND OF THE INVENTION

The present invention relates to a method for fabricating a Group III nitride semiconductor substrate for use in a semiconductor laser which emits light at a shorter wavelength such as blue or purple light and in a transistor operating at a high temperature.

A Group III nitride semiconductor represented by $Al_xGa_yIn_{1-x-y}N$ ($0 \leq x \leq 1$, $0 \leq y \leq 1$, $0 \leq x+y \leq 1$) (hereinafter referred to as a Group III nitride semiconductor) is a material used in an optical device which emits light at a wavelength ranging in color from red to ultraviolet so that the applications thereof to a light emitting device and a light receiving device are expected. Thus far, a Group III nitride semiconductor film of relatively high quality has been formed conventionally by crystal growth on a sapphire substrate.

However, since the Group III nitride semiconductor film and the sapphire substrate do not lattice-match each other, the Group III nitride semiconductor film contains numerous crystal defects so that a device using a Group III nitride semiconductor has degraded properties.

If the Group III nitride semiconductor film formed on the sapphire substrate is used in a semiconductor laser or transistor, all electrodes should be formed on the Group III nitride semiconductor film since the sapphire substrate is a so-called insulating substrate which does not allow the passage of electricity. This has complicated a fabrication process for a device composed of a Group III nitride semiconductor and reduced the production yield thereof.

To increase the fabrication yield and performance of the device using the Group III nitride semiconductor, a group III nitride semiconductor substrate (especially a GaN substrate) having a high quality and a large area has been in growing demand. Under such circumstances, there have been proposed various methods in each of which a Group III nitride semiconductor film is grown on a substrate made of a different type of material (sapphire substrate or the like) and then the substrate made of the different type of material is removed.

For example, there has been known a conventional method in which a sapphire substrate and a GaN film are separated from each other by irradiation with an intense laser beam (Michael K. Kelly et al., Japanese Journal of Applied Physics Vol.38 p.L217–L219, 1999). A description will be given herein below to the conventional method with reference to FIGS. 11A to 11C, which are cross-sectional views illustrating the process steps of the conventional method.

In the step shown in FIG. 11A, a GaN layer 102 with a thickness of 200 to 300 μm is formed on a sapphire substrate 101 having a diameter of 2 inches and a C surface as a principal surface by using hydride vapor phase epitaxy (hereinafter referred to as HVPE).

Next, in the step shown in FIG. 11B, the sapphire substrate 101 formed with the GaN layer 102 is retrieved from a HVPE reactor. Then, the lower surface of the GaN layer 102a is entirely scanned with a laser beam at a wavelength of 355 nm applied thereto through the sapphire substrate 101. The arrow in the drawing represents the laser beam. As a result, heat is generated at the portion irradiated with the laser beam to decompose a lower portion of the GaN layer 102.

Next, in the step shown in FIG. 11C, the sapphire substrate 101 and the GaN layer 102 are separated from each other so that an independent GaN substrate 102a is obtained.

However, the foregoing method has the following problems.

The respective thermal conductivities of GaAs and InP which are representatives of Group III–V compound semiconductors are 0.54 W/cmK and 0.68 W/cmK, while the thermal conductivity of Si used for a submount for heat dissipation is 1.5 W/cmK.

On the other hand, the thermal conductivity of GaN is 1.3 W/cmK. From a comparison between the thermal conductivity of GaN and the thermal conductivities of the foregoing materials, it will be understood that GaN is a material which readily conducts heat. In accordance with the conventional method which irradiates GaN with the laser beam, the heat generated in the lower portion of the GaN layer 102 through the absorption of the laser beam is likely to be diffused. This causes the problem that an amount of heat required to completely decompose the portion of the GaN layer 102 irradiated with the laser beam in the step shown in FIG. 11B is insufficient and the efficiency with which GaN is decomposed is reduced. If the efficiency with which GaN is decomposed is reduced, the sapphire substrate 101 and the GaN layer 102 should be separated from each other by increasing the number of times that the GaN layer 102 is scanned with the laser beam and thereby supplying a sufficient amount of heat to completely decompose the portion of the GaN layer 102 irradiated with the laser beam. Accordingly, the time required to perform the step shown in FIG. 11B is increased so that productivity is lowered.

Since GaN and sapphire do not lattice-match each other, the GaN layer 102 contains numerous crystal defects and distortions. As a result, an impact resulting from the release of a stress when GaN is decomposed may cause a fracture in the GaN substrate 102a obtained. If the number of scannings is increased, the probability of a fracture occurring in the GaN substrate 102a is increased.

Even if the GaN substrate 102a undergoes, a crack may remain within the GaN substrate 102a. If a device such as a light-emitting diode or a laser diode is fabricated by using a GaN substrate 102a having a crack remaining therein, the crack causes a leakage current and reduces the reliability of the device.

SUMMARY OF THE INVENTION

The present invention has been achieved to solve the foregoing problems and it is therefore an object of the present invention to provide a high-quality Group III nitride semiconductor substrate.

A method for fabricating a Group III nitride semiconductor substrate according to the present invention comprises the steps of: (a) preparing a substrate; (b) forming, on the substrate, a first semiconductor layer composed of a Group III nitride semiconductor; (c) forming, on the first semiconductor layer, a heat diffusion suppressing layer lower in thermal conductivity than the first semiconductor layer; (d) forming, on the heat diffusion suppressing layer, a second semiconductor layer composed of a Group III nitride semiconductor; and (e) irradiating the first semiconductor layer through the substrate with a light beam transmitted by the substrate and absorbed by the first semiconductor layer to decompose the first semiconductor layer.

In accordance with the present invention, the heat diffusion suppressing layer lower in thermal conductivity than the first semiconductor layer is formed between the first and second semiconductor layers to suppress the diffusion of heat generated through the absorption of the light beam by the first semiconductor layer. Accordingly, the majority of the generated heat contributes to the decomposition of the first semiconductor layer so that the first semiconductor layer is decomposed efficiently. Even if the number of scannings with the light beam is smaller than in the conventional embodiment, heat required to decompose the first semiconductor layer completely can be supplied in a sufficient amount so that productivity is increased. Since the number of scannings with the light beam is smaller than in the conventional embodiment, the probability of a fracture occurring in the Group III nitride semiconductor substrate separated from the second semiconductor layer can be reduced.

The Group III nitride semiconductor composing the heat diffusion suppressing layer may be lower in thermal conductivity than the Group III nitride semiconductor composing the first semiconductor layer.

The heat diffusion suppressing layer may be composed of a semiconductor represented by $In_xGa_{1-x}N$ ($0<x\leq 1$).

Preferably, the step (c) includes forming the heat diffusion suppressing layer and then forming an opening extending through the heat diffusion suppressing layer and reaching the first semiconductor layer.

In the arrangement, the Group III nitride semiconductor crystal composing the second semiconductor layer grows along the upper surface of the heat diffusion suppressing layer during the formation of the second semiconductor layer. As a result, dislocation occurring in the first semiconductor layer is hardly propagated to the second semiconductor layer so that the number of spots undergoing dislocation in the second semiconductor layer is significantly reduced. This allows the fabrication of a Group III nitride semiconductor substrate with an excellent crystalline property.

The heat diffusion suppressing layer may be composed of a metal.

The heat diffusion suppressing layer may be composed of at least one metal selected from the group consisting of Ni, Pt, and Ti.

The heat diffusion suppressing layer may be composed of a dielectric material.

The heat diffusion suppressing layer may be composed of at least one dielectric material selected from the group consisting of a silicon dioxide film and a silicon nitride film.

Preferably, the method further comprises, after the step (e), the step of: (f) removing the heat diffusion suppressing layer.

The step (f) may include removing the heat diffusion suppressing layer by etching.

The step (f) may include removing the heat diffusion suppressing layer by polishing.

Preferably, the substrate is lower in thermal conductivity than the group III nitride semiconductor composing the first semiconductor layer.

The arrangement suppresses conduction of heat to the substrate and allows a large amount of heat to contribute to the decomposition of the first semiconductor layer.

Another method for fabricating a Group III nitride semiconductor substrate according to the present invention comprises the steps of: (a) preparing a substrate; (b) forming, on the substrate, a first semiconductor layer composed of a Group III nitride semiconductor; (c) forming, on the first semiconductor layer, a light reflecting layer; (d) forming, on the light reflecting layer, a second semiconductor layer composed of a Group III nitride semiconductor; and (e) irradiating the first semiconductor layer through the substrate with a light beam transmitted by the substrate and absorbed by the first semiconductor layer to decompose the first semiconductor layer, the light reflecting layer reflecting the light beam applied in the step (e).

According to the present invention, the laser beam which has not been absorbed by the lower portion of the first semiconductor layer during light beam application is reflected back by the light reflecting layer to contribute the thermal decomposition of the first semiconductor layer. This reduces the threshold of the irradiation energy of the light beam required to thermally decompose the first semiconductor layer to a value lower than in the conventional embodiment. As means for lowering the threshold value of the irradiation energy of the light beam, the diameter of the light beam can be increased. Even if the number of scannings with the light beam is smaller than in the conventional embodiment, heat required to decompose the first semiconductor layer completely can be supplied in a sufficient amount so that productivity is increased. Since the number of scannings with the light beam is smaller than in the conventional embodiment, the probability of a fracture occurring in the Group III nitride semiconductor substrate separated from the second semiconductor layer can be reduced.

Preferably, the first semiconductor layer has a first layer composed of a Group III nitride semiconductor having a band gap smaller than energy of the light beam and a second layer composed of a Group III nitride semiconductor having a band gap larger than the energy of the light beam, the second layer being formed on the first layer.

In the arrangement, the light beam is not absorbed by the second layer. As a result, attenuation is suppressed when the light beam which has not been absorbed by the lower portion of the first semiconductor layer is reflected by the light reflecting layer. This provides a higher utilization of the irradiation energy of the light beam contributing to the thermal decomposition of the first semiconductor layer than in the conventional embodiment.

Preferably, the step (c) includes forming the light reflecting layer and then forming an opening extending through the light reflecting layer and reaching the first semiconductor layer.

In the arrangement, the Group III nitride semiconductor crystal composing the second semiconductor layer grows along the upper surface of the heat diffusion suppressing layer during the formation of the second semiconductor layer. As a result, dislocation occurring in the first semiconductor layer is hardly propagated to the second semiconductor layer so that the number of spots undergoing dislocation in the second semiconductor layer is significantly reduced. This allows the fabrication of a Group III nitride semiconductor substrate with an excellent crystalline property.

The light reflecting layer may be composed of a dielectric material.

The light reflecting layer may be a multilayer film composed of silicon dioxide films and titanium oxide films which are alternately stacked in layers.

Still another method for fabricating a Group III nitride semiconductor substrate according to the present invention comprises the steps of: (a) preparing a substrate; (b) forming a light scattering portion within the substrate; (c) forming, on the substrate, a semiconductor layer composed of a Group III nitride semiconductor; and (d) irradiating the semiconductor layer through the substrate with a light beam transmitted by the substrate and absorbed by the semiconductor layer to decompose a lower portion of the semiconductor layer.

In accordance with the present invention, the light beam is scattered by the light scattering portion to have a larger diameter upon reaching the semiconductor layer. Even if the number of scannings with the light beam is smaller than in the conventional embodiment, heat required to decompose the first semiconductor layer completely can be supplied in a sufficient amount so that productivity is increased. Since the number of scannings with the light beam is smaller than in the conventional embodiment, the probability of a fracture occurring in the Group III nitride semiconductor substrate separated from the second semiconductor layer can be reduced.

The step (b) may include implanting ions into the substrate to form the light scattering portion within the substrate.

The step (c) may be performed after the step (a) and the step (b) may include implanting the ions into the substrate through the semiconductor layer to form the light scattering portion within the substrate, the method further comprising, between the steps (b) and (d), the step of: forming, on the semiconductor layer, another semiconductor layer composed of a Group III nitride semiconductor.

The step (b) may include forming, as the light scattering portion, a plurality of depressed portions in a lower portion of the substrate.

The plurality of depressed portions may be formed with application of a plasma.

DETAILED DESCRIPTION OF THE INVENTION

Figure 1A:
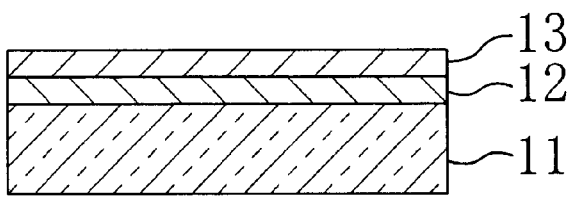
FIGS. 1A to 1E are cross-sectional views illustrating the process steps of a method for fabricating a GaN substrate according to EMBODIMENT 1 of the present invention.

Referring now to the drawings, the embodiments of the present invention will be described. For the sake of simplicity, components used commonly in the individual embodiments will be designated by the same reference numerals.

Embodiment 1

A method for fabricating a GaN substrate according to EMBODIMENT 1 of the present invention will be described with reference to FIGS. 1A to 1E, which are cross-sectional views illustrating the process steps of the fabrication method for the GaN substrate according to the present embodiment.

First, in the step shown in FIG. 1A, a sapphire substrate 11 (with a diameter of 2 inches and a thickness of 300 $\mu$m) having a surface C as a principal surface is introduced into a MOVPE reactor. The sapphire substrate 11 is then thermally treated in a hydrogen atmosphere at 1050° C. and cooled to 500° C. Subsequently, a GaN buffer layer (not shown) with a thickness of 20 nm is formed on the sapphire substrate 11 by using trimethylgallium (TMG) as a Group III raw material, ammonia as a Group V raw material, and $H_2$ as a carrier gas. A GaN layer 12 with a thickness of 200 nm is formed on the GaN buffer layer by raising the temperature again to 1050° C. Then, an InN layer 13 with a thickness of 50 nm is formed on the GaN layer 12 by using trimethylindium (TMI) as a Group III raw material and ammonia as a Group V raw material by lowering the temperature to 700° C. Thereafter, the substrate is cooled to a room temperature and retrieved from the MOVPE reactor.

Figure 1B:
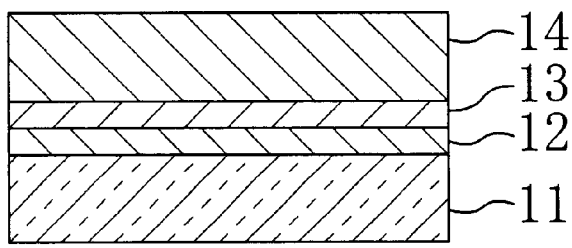

Next, in the step shown in FIG. 1B, the sapphire substrate 11 formed with the GaN layer 12 and the InN layer 13 is introduced into a HVPE reactor. Then, a GaN layer 14 is formed on the InN layer 13 by supplying a GaCl from a Group III line and an ammonia gas together with a carrier gas from a Group V line. Specifically, GaCl supplied from the Group III line is generated by introducing a HCl gas into a boat filled with Ga metal heated to 900° C. and using nitrogen as a carrier gas. At this time, the sapphire substrate 11 is heated to 1050° C. and the GaN layer 14 is grown at a rate of 50 $\mu$m/hour for six hours so that the GaN layer 14 eventually has a thickness of 300 $\mu$m. Thereafter, the substrate is cooled to a room temperature and retrieved from the HVPE reactor.

Figure 1C:
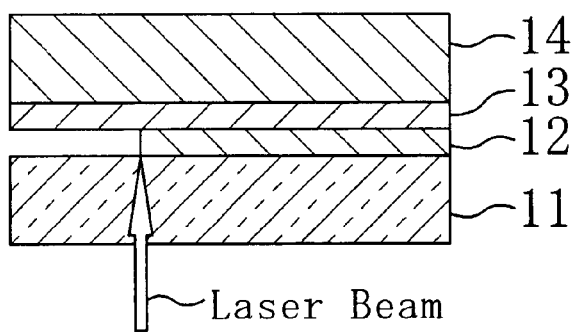

Next, in the step shown in FIG. 1C, the lower surface of the GaN layer 12 is entirely scanned with a laser beam applied thereto through the sapphire substrate 11. This decomposes the GaN layer 12. The laser beam used is a third-order harmonic (355 nm) of a Nd:YAG laser with an irradiation energy of 0.3 J/cm$^2$ and a pulse width of 5 ns. The diameter of the laser beam during scanning is 1 mm. Since the sapphire substrate 11 is transparent with respect to the wavelength of the laser beam, the laser beam is transmitted by the sapphire substrate 11. Since the wavelength of the absorption edge of GaN is 360 to 370 nm, the transmitted laser beam is absorbed by the GaN layer 12 formed on the sapphire substrate 11 to decompose the GaN layer 12.

Figure 1D:
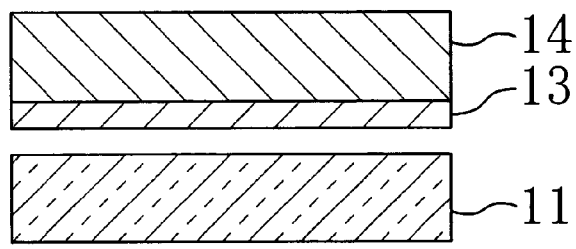

Next, in the step shown in FIG. 1D, the sapphire substrate 11 is separated from the InN layer 13 and the GaN layer 14. Since the GaN layer 12 has been decomposed in the step shown in FIG. 1C, it is easy to separate the sapphire substrate 11 from the InN layer 13 and the GaN layer 14.

Figure 1E:
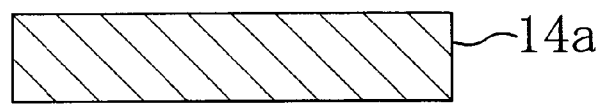

Next, in the step shown in FIG. 1E, the InN layer 13 formed under the GaN layer 14 is polished away. This provides an independent GaN substrate 14a. If a device is formed on a GaN substrate from which the InN layer 13 has not been removed, a heat releasing characteristic may be degraded to affect the characteristics of the device. It is therefore preferable to remove the InN layer 13.

In the foregoing method according to the present embodiment, the InN layer 13 lower in thermal conductivity than the GaN layer 12 is formed between the GaN layer 12 and the GaN layer 14. The thermal conductivity of InN is 0.8 W/cmK and lower than the thermal conductivity of GaN which is 1.3 W/cmK. Consequently, heat resulting from the absorption of the laser beam by the GaN layer 12 is hard to conduct in the InN layer 13. Thus, the InN layer 13 suppresses heat diffusion. Accordingly, the majority of the generated heat contributes to the decomposition of the GaN layer 12 so that the GaN layer 12 is decomposed efficiently.

In addition, the present embodiment has used the sapphire substrate 11 (with a thermal conductivity of 0.46 W/cmK) which is lower in thermal conductivity than the GaN layer 12. This suppresses conduction of heat to the sapphire substrate 11 so that more heat is allowed to contribute to the decomposition of the GaN layer 12.

Even if the number of scannings with a laser beam is smaller than in the conventional embodiment, heat required to decompose the GaN layer 12 completely can be supplied in a sufficient amount so that productivity is improved. Since the number of scannings with the laser beam is smaller than in the conventional method, the probability of a fracture occurring in the GaN substrate 14a is reduced.

Although the present embodiment has formed the InN layer 13 as a layer having a thermal conductivity lower than that of the GaN layer 12, $In_xGa_{1-x}N$ layer (0<x<1) may also be formed instead. In general, the thermal conductivity of a mixed crystal semiconductor tends to be lower than that of a binary compound. Since the thermal conductivity of $In_xGa_{1-x}N$ is lower than that of GaN irrespective of the composition ratio of In, heat generated by the absorption of the laser beam by the GaN layer 12 is harder to conduct than in the InN layer. This allows more efficient decomposition of the GaN layer 12.

If the thickness of the InN layer 13 exceeds a critical value, crystal defects occurring within the InN layer 13 are increased to cause a crack in some cases. If the crystal defects within the InN layer 13 are increased or a crack occurs, dislocation is likely to occur in the GaN layer 14 formed on the InN layer 13. Therefore, it is preferable for the thickness of the InN layer 13 not to exceed the critical value.

Embodiment 2

A method for fabricating a GaN substrate according to EMBODIMENT 2 of the present invention will be described with reference to FIGS. 2A to 2F, which are cross-sectional views illustrating the process steps of the fabrication method for a GaN substrate according to the present embodiment.

Figure 2A:
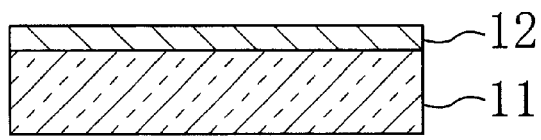
FIGS. 2A to 2F are cross-sectional views illustrating the process steps of a method for fabricating a GaN substrate according to EMBODIMENT 2 of the present invention.

First, in the step shown in FIG. 2A, a sapphire substrate 11 (with a diameter of 2 inches and a thickness of 300 $\mu$m) having a surface C as a principal surface is introduced into a MOVPE reactor. The sapphire substrate 11 is then thermally treated in a hydrogen atmosphere at 1050° C. and cooled to 500° C. Subsequently, a GaN buffer layer (not shown) with a thickness of 20 nm is formed on the sapphire substrate 11 by using trimethylgallium (TMG) as a Group III raw material, ammonia as a Group V raw material, and $H_2$ as a carrier gas. A GaN layer 12 with a thickness of 200 nm is formed on the GaN buffer layer by raising the temperature again to 1050° C. Thereafter, the substrate is cooled to a room temperature and retrieved from the MOVPE reactor.

Figure 2B:
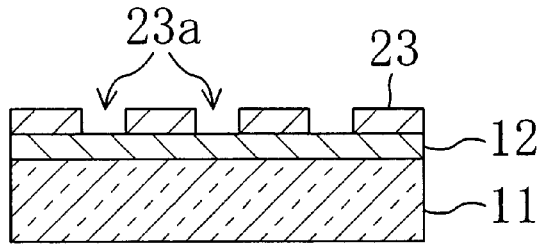
Figure 3:
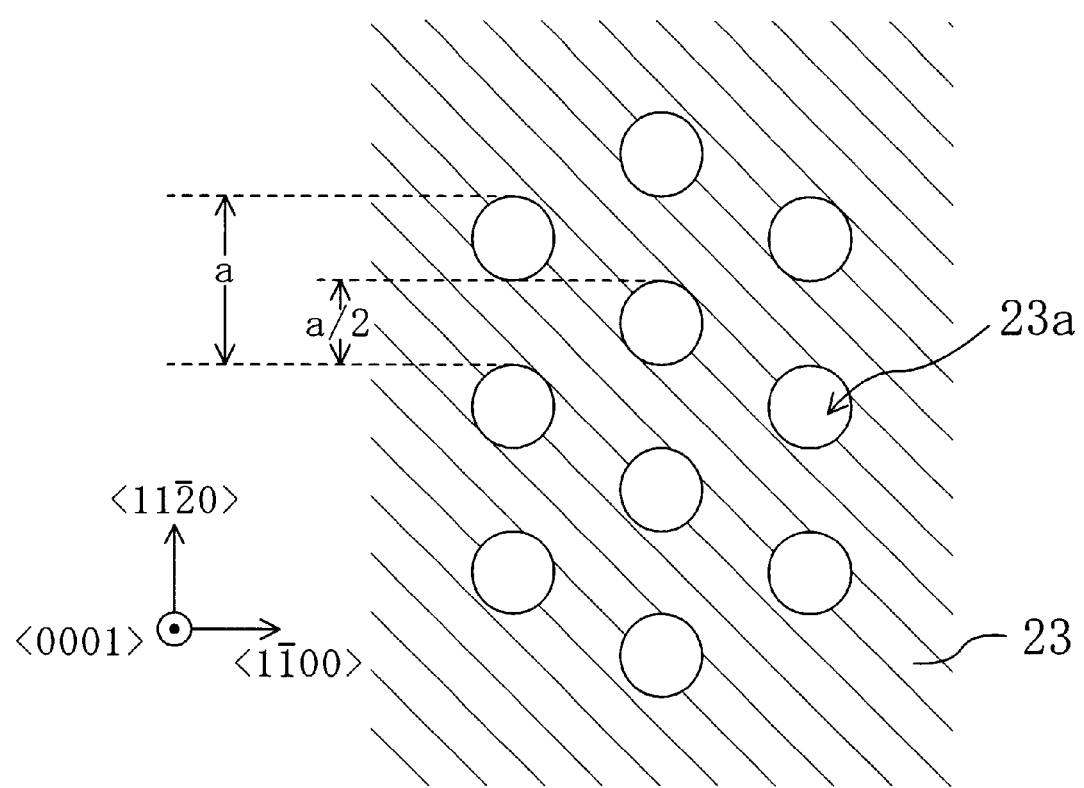
FIG. 3 is a top view of the substrate shown in FIG. 2B.

Next, in the step shown in FIG. 2B, a Ni layer with a thickness of 200 nm is formed by vapor deposition on the GaN layer 12. Subsequently, the Ni layer is patterned into a Ni film 23 having openings 23a. The patterning of the Ni layer is performed by photolithography and etching so that the circular openings 23a each having a diameter of 2.5 $\mu$m and reaching the GaN layer 12 are formed, as shown in FIG. 3. The openings 23a are arranged in rows with a given pitch a (5 $\mu$m in the present embodiment) in the <11–20> direction of the GaN layer 12. The openings 23a in the rows which are adjacent in the <1–100> direction of the GaN layer 12 are at positions deviated from each other by a given pitch a/2 (2.5 $\mu$m in the present embodiment). In the present embodiment, the <11–20> direction indicates <11$\bar{2}$0> and the <1-100> direction indicate

<1$\bar{1}$00>

Figure 2C:
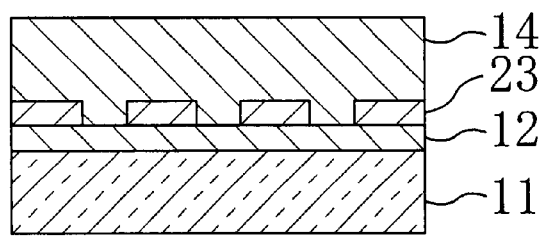

Next, in the step shown in FIG. 2C, the substrate obtained in the step shown in FIG. 2B is introduced into a HVPE reactor. Then, the substrate is thermally treated in a nitrogen and ammonia atmosphere at 800° C. for ten minutes so that an impurity on the substrate surface is removed therefrom and a GaN layer 14 is formed on the substrate. The method for forming the GaN layer 14 is the same as the method performed in the step shown in FIG. 1B according to EMBODIMENT 1.

At this time, a GaN crystal does not grow on the Ni film 23 but starts growing on the GaN layer 12 exposed in the openings 23a. As the GaN crystal continues growing, the GaN crystal which has started growing on the GaN layer 12 exposed in the openings 23a grows on the Ni film 23 along the upper surface thereof to cover the Ni film 23 in cooperation with the GaN crystal. Subsequently, a GaN crystal grows on the GaN crystal covering the Ni film 23, whereby the GaN layer 14 is formed. By thus growing the GaN layer 14 to a thickness of 300 $\mu$m, the substrate is cooled to a room temperature and retrieved from the HVPE reactor.

Figure 2D:
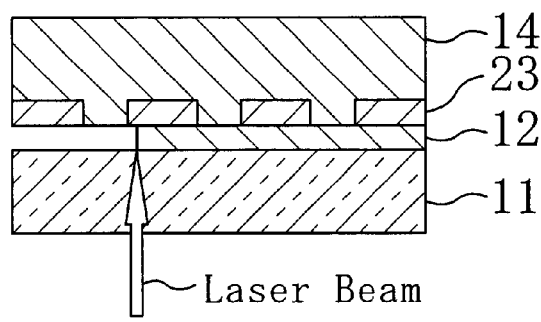

Next, in the step shown in FIG. 2D, the lower surface of the GaN layer 12 is entirely scanned with a laser beam applied thereto through the sapphire substrate 11, similarly to EMBODIMENT 1. The laser beam used is a third-order harmonic (355 nm) of a Nd:YAG laser with an irradiation energy of 0.3 $J/cm^2$ and a pulse width of 5 ns. The diameter of the laser beam during scanning is 1 mm. Since the wavelength of absorption edge of GaN is 360 to 370 nm, the laser beam at a wavelength of 355 nm is absorbed by the GaN layer 12 so that heat is generated. The generated heat thermally decomposes the GaN layer 12.

Figure 2E:
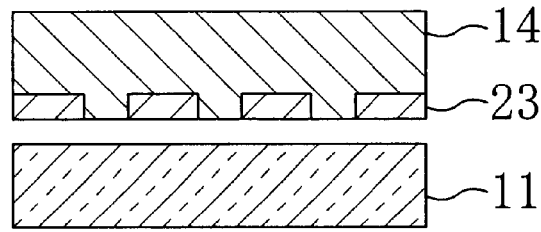

Next, in the step shown in FIG. 2E, the sapphire substrate 11 is separated from the Ni film 23 and the GaN layer 14. Since the GaN layer 12 has been decomposed in the step shown in FIG. 2D, it is easy to separate the sapphire substrate 11 from the Ni film 23 and the GaN layer 14.

Figure 2F:
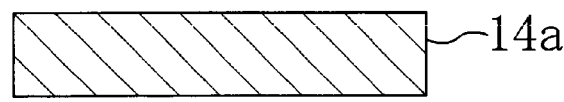

Next, in the step shown in FIG. 2F, the Ni film 23 formed under the GaN layer 14 is removed by wet etching using a nitric acid. This provides an independent GaN substrate 14a. If a device is formed on a GaN substrate from which the Ni film 23 has not been removed, the heat releasing characteristic of the device may be degraded due to the lower thermal conductivity of the Ni film 23, thereby affecting the characteristics of the device. It is therefore preferable to remove the Ni film 23. The Ni film 23 may also be removed by polishing.

In the method according to the present embodiment, the Ni film 23 lower in thermal conductivity than the GaN layer 12 is formed between the GaN layer 12 and the GaN layer 14. In contrast to the high thermal conductivity of a metal such as Ag or Cu, the thermal conductivity of Ni is 0.84 W/cmK, which is lower than the thermal conductivity of GaN. Consequently, heat resulting from the absorption of the laser beam by the GaN layer 12 is hard to conduct in the Ni film 23. Thus, the Ni film 23 suppresses heat diffusion. Accordingly, the majority of the generated heat contributes to the decomposition of the GaN layer 12 so that the GaN layer 12 is decomposed efficiently.

In addition, the present embodiment has used the sapphire substrate 11 (with a thermal conductivity of 0.46 W/cmK) which is lower in thermal conductivity than the GaN layer 12. This suppresses conduction of heat to the sapphire substrate 11 so that more heat is allowed to contribute to the decomposition of the GaN layer 12.

As a metal material having a thermal conductivity lower than that of GaN and a melting point equal to or higher than a temperature (1050° C.) at which GaN is grown, Pt (0.71 W/cmK), Ti (0.22 W/cmK), or the like can be listed other than Ni. It is therefore possible to use a film composed of such a metal in place of the Ni film 23. Although heat is transmitted by lattice vibration and free electrons, heat transport by free electrons is generally predominant. However, since the number of free electrons is reduced in an alloy and heat transport by lattice vibration becomes predominant, the thermal conductivity tends to be lower in the alloy than in a constituent metal of the alloy. Therefore, an alloy film may also be used instead of the Ni film 23.

In the step shown in FIG. 2B, the surface of the Ni film 23 may also be covered with a silicon dioxide film or the like. This prevents a chemical reaction between ammonia or hydrogen and the Ni film 23. It will easily be understood that, even if a Pt film, a Ti film, or an alloy film as described above is used instead of the Ni film 23, the surface of such a metal film may also be covered with a silicon dioxide film or the like.

In the present embodiment, the GaN crystal grows on the Ni film 23 along the upper surface thereof during the formation of the GaN layer 14 so that dislocation occurring in the GaN layer 12 is hardly propagated to the GaN layer 14. Consequently, the number of spots undergoing dislocation in the GaN layer 14 is significantly reduced. This allows the fabrication of a GaN substrate with an excellent crystalline property in the present embodiment.

Although the present embodiment has formed the Ni film 23 having the circular openings 23a, the configuration of the openings 23a is not limited thereto. The openings 23a may also have a striped or rectangular configuration. Whatever configuration the openings have, the effect of preventing thermal diffusion is higher as the area of the upper surface of the GaN layer 12 exposed in the openings is smaller.

In the present embodiment, moreover, the openings 23a are arranged in rows with a given pitch a (5 μm in the present embodiment) in the <11-20> direction of the GaN layer 12, while the openings 23a in the rows which are adjacent in the <1-100> direction of the GaN layer 12 are at positions deviated from each other by a given pitch a/2 (2.5 μm in the present embodiment). With the openings 23a thus arranged, crystal growing surfaces form the individual sides of a hexagon centering around each of the openings 23a on the Ni film 23 since the GaN crystal has a hexagonal close-packed structure. If GaN crystals grown from the adjacent openings 23a come in contact with each other, therefore, a lattice defect is less likely to occur. As a result, a GaN layer 14 containing a smaller number of lattice defects can be formed and a high-quality GaN substrate is obtained.

It is to be noted that the present embodiment has used the Ni film 23b having the openings 23a also as a mask for lateral growth of the GaN layer 14. This obviates the necessity to newly form a mask for lateral growth of the GaN layer 14 and reduces the number of fabrication process steps.

Embodiment 3

A method for fabricating a GaN substrate according to EMBODIMENT 3 of the present invention will be described with reference to FIGS. 4A to 4F, which are cross-sectional views illustrating the process steps of the fabrication method for a GaN substrate according to the present embodiment.

Figure 4A:
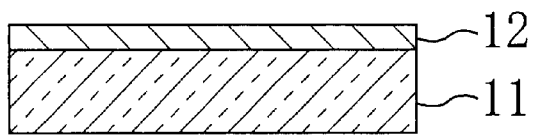
FIGS. 4A to 4F are cross-sectional views illustrating the process steps of a method for fabricating a GaN substrate according to EMBODIMENT 3 of the present invention.

First, in the step shown in FIG. 4A, a sapphire substrate 11 (with a diameter of 2 inches and a thickness of 300 μm) having a surface C as a principal surface is introduced into a MOVPE reactor. The sapphire substrate 11 is then thermally treated in a hydrogen atmosphere at 1050° C. and cooled to 500° C. Subsequently, a GaN buffer layer (not shown) with a thickness of 20 nm is formed on the sapphire substrate 11 by using trimethylgallium (TMG) as a Group III raw material and ammonia as a Group V raw material. A GaN layer 12 with a thickness of 200 nm is formed on the GaN buffer layer by raising the temperature again to 1050° C. Thereafter, the substrate is cooled to a room temperature and retrieved from the MOVPE reactor.

Figure 4B:
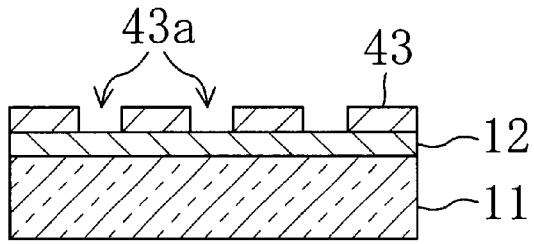

Next, in the step shown in FIG. 4B, a SiO$_2$ layer with a thickness of 200 nm is formed by sputtering on the GaN layer 12. Subsequently, the SiO$_2$ layer is patterned into a silicon dioxide film 43 having openings 43a. The pattering of the SiO$_2$ layer is performed by photolithography or etching so that the circular openings 43a each having a diameter of 2.5 μm and reaching the GaN layer 12 are formed, as shown in FIG. 3. The openings 43a are arranged in rows with a given pitch a (5 μm in the present embodiment) in the <11-20> direction of the GaN layer 12. The openings 43a in the rows which are adjacent in the <1-100> direction of the GaN layer 12 are at positions deviated from each other by a given pitch a/2 (2.5 μm in the present embodiment).

Figure 4C:
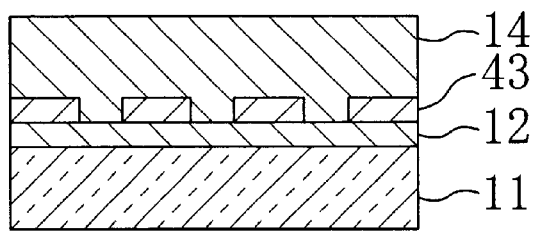

Next, in the step shown in FIG. 4C, the substrate obtained in the step shown in FIG. 4B is introduced into a HVPE reactor. Then, the substrate is thermally treated in a nitrogen and ammonia atmosphere at 800° C. for ten minutes so that an impurity on the substrate surface is removed therefrom and a GaN layer 14 is formed on the substrate. The method for forming the GaN layer 14 is the same as the method performed in the step shown in FIG. 1B according to EMBODIMENT 1.

At this time, a GaN crystal does not grow on the silicon dioxide film 43 but starts growing on the GaN layer 12 exposed in the openings 43a. As the GaN crystal continues growing, the GaN crystal which has started growing on the GaN layer 12 exposed in the openings 43a grows on the silicon dioxide film 43 along the upper surface thereof to eventually cover the silicon dioxide film 43 in cooperation with the GaN crystal. Subsequently, a GaN crystal grows on the GaN crystal covering the silicon dioxide film 43, whereby the GaN layer 14 is formed. By thus growing the GaN layer 14 to a thickness of 300 μm, the substrate is cooled to a room temperature and retrieved from the HVPE reactor.

Figure 4D:
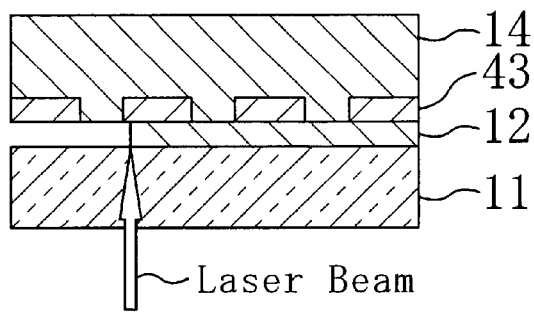

Next, in the step shown in FIG. 4D, the lower surface of the GaN layer 12 is entirely scanned with a laser beam applied thereto through the sapphire substrate 11, similarly to EMBODIMENT 1. The laser beam used is a third-order harmonic (355 nm) of a Nd:YAG laser with an irradiation energy of 0.3 J/cm$^2$ and a pulse width of 5 ns. The diameter of the laser beam during scanning is 1 mm. Since the wavelength of absorption edge of GaN is 360 to 370 nm, the laser beam at a wavelength of 355 nm is absorbed by the GaN layer 12 so that heat is generated. The generated heat thermally decomposes the GaN layer 12.

Figure 4E:
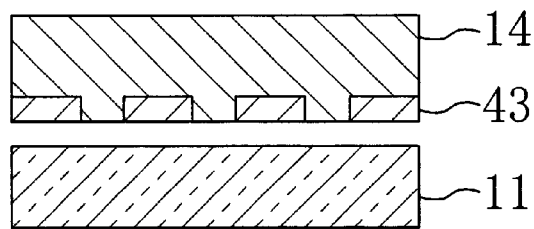

Next, in the step shown in FIG. 4E, the sapphire substrate 11 is separated from the silicon dioxide film 43 and the GaN layer 14. Since the GaN layer 12 has been decomposed in the step shown in FIG. 4D, it is easy to separate the sapphire substrate 11 from the silicon dioxide film 43 and the GaN layer 14.

Figure 4F:
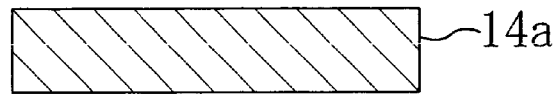

Next, in the step shown in FIG. 4F, the silicon dioxide film 43 formed under the GaN layer 14 is removed by wet etching using a solution composed of a hydrofluoric acid and an ammonium fluoride. This provides an independent GaN substrate 14a. If a device is formed on a GaN substrate from which the silicon dioxide film 43 has not been removed, the heat releasing characteristic of the device may be degraded due to the lower thermal conductivity of the silicon dioxide film 43, thereby affecting the characteristics of the device. It is therefore preferable to remove the silicon dioxide film 43. The silicon dioxide film 43 may also be removed by polishing.

In the present embodiment, the silicon dioxide film 43 lower in thermal conductivity than the GaN layer 12 is formed between the GaN layer 12 and the GaN layer 14. The thermal conductivity of $SiO_2$ composing the silicon dioxide film 43 is 0.014 W/cmK, which is much lower than the thermal conductivity of GaN and also lower than the thermal conductivity of the metal film used in EMBODIMENT 2. Consequently, heat resulting from the absorption of the laser beam by the GaN layer 12 is hard to conduct in the silicon dioxide film 43. Thus, the silicon dioxide film 43 has a high effect of suppressing heat diffusion. Accordingly, the majority of the generated heat contributes to the decomposition of the GaN layer 12 so that the GaN layer 12 is decomposed efficiently.

In such a non-metal material composing the silicon dioxide film 43 in the present embodiment, free electrons do not conduct heat. Moreover, since atomic arrangement is irregular in a non-crystalline material such as a dielectric material, the efficiency of heat conduction is low. Accordingly, the thermal conductivity of a non-metal and non-crystalline material is generally lower than the thermal conductivities of a metal and a crystalline material. Instead of the silicon dioxide film 43 according to the present embodiment, therefore, a silicon nitride film (thermal conductivity: 0.18 W/cmK), e.g., may also be used as a film made of a non-metal and non-crystalline material.

In addition, the present embodiment has used the sapphire substrate 11 (with a thermal conductivity of 0.46 W/cmK) which is lower in thermal conductivity than the GaN layer 12. This suppresses conduction of heat to the sapphire substrate 11 so that more heat is allowed to contribute to the decomposition of the GaN layer 12.

In the present embodiment also, the GaN crystal grows on the silicon dioxide film 43 along the upper surface thereof, similarly to EMBODIMENT 2, so that dislocation is hardly propagated to the GaN layer 14. This allows the fabrication of a GaN substrate with an excellent crystalline property in the present embodiment.

Although the present embodiment has formed the silicon dioxide film 43 having the circular openings 43a, the configuration of the openings 43a is not limited thereto. The openings 43a may also have a striped or rectangular configuration. Whatever configuration the openings have, the effect of preventing thermal diffusion is higher as the area of the upper surface of the GaN layer 12 exposed in the openings is smaller.

Since the openings 43a are also provided in the present embodiment, similarly to EMBODIMENT 2, a GaN layer 14 containing a smaller number of lattice defects can be formed and a high-quality GaN substrate is obtained.

It is to be noted that the present embodiment has used the silicon dioxide film 43b also as a mask for lateral growth of the GaN layer 14. This obviates the necessity to newly form a mask for lateral growth of the GaN layer 14 and reduces the number of fabrication process steps.

GaN and examples of a material lower in thermal conductivity than GaN used in EMBODIMENTS 1 to 3 are shown below in Table 1. In each of EMBODIMENTS 1 to 3, a film made of any of the materials shown in Table 1 may also be provided instead of the InN layer 13, the Ni film 23, or the silicon dioxide film 43 each lower in thermal conductivity than GaN.

TABLE 1

| Materials | Thermal Conductivity (W/cmK) |
|---|---|
| GaN | 1.3 |
| InN | 0.8 |
| Ni | 0.84 |
| Pt | 0.71 |
| Ti | 0.22 |
| $SiO_2$ | 0.014 |
| SiN | 0.18 |

Embodiment 4

A method for fabricating a GaN substrate according to EMBODIMENT 4 of the present invention will be described with reference to FIGS. 5A to 5F, which are cross-sectional views illustrating the process steps of the fabrication method for a GaN substrate according to the present embodiment.

Figure 5A:
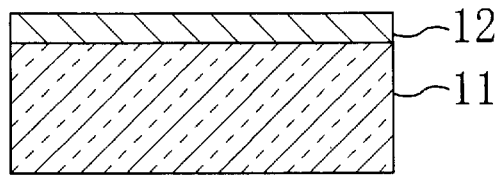
FIGS. 5A to 5F are cross-sectional views illustrating the process steps of a method for fabricating a GaN substrate according to EMBODIMENT 4 of the present invention.

First, in the step shown in FIG. 5A, a sapphire substrate 11 (with a diameter of 2 inches and a thickness of 300 μm) having a surface C as a principal surface is introduced into a MOVPE reactor. The sapphire substrate 11 is then thermally treated in a hydrogen atmosphere at 1050° C. and cooled to 500° C. Subsequently, a GaN buffer layer (not shown) with a thickness of 20 nm is formed on the sapphire substrate 11 by using trimethylgallium (TMG) as a Group III raw material, ammonia as a Group V raw material, and $H_2$ as a carrier gas. A GaN layer 12 with a thickness of 300 nm is formed on the GaN buffer layer by raising the temperature again to 1050° C. Thereafter, the substrate is cooled to a room temperature and retrieved from the MOVPE reactor.

Instead of the GaN buffer layer, a GaN layer 21 may also be formed on the sapphire substrate 11. As a carrier gas, $N_2$ or a gas mixture of $N_2$ and $H_2$ may also be used.

Figure 5B:
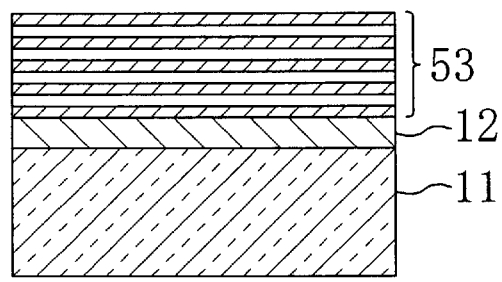

Next, in the step shown in FIG. 5B, $SiO_2$ layers each having a thickness of 61 nm and $TiO_2$ layers each having a thickness of 35 nm are formed alternately on the GaN layer 12 by sputtering, thereby forming a high reflectivity film 53. In the present embodiment, the high reflectivity film 53 is composed of the total of nine layers consisting of five $SiO_2$ layers and four $TiO_2$ layers. The reflectivity of the high reflectivity film 53 formed in the present embodiment against a third-order harmonic of a Nd:YAG laser beam is about 97%.

Figure 5C:
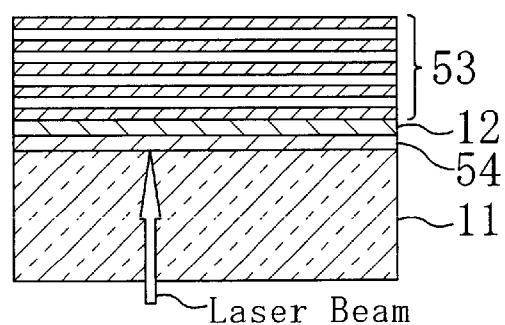

Next, in the step shown in FIG. 5C, the lower surface of the GaN layer 12 is entirely scanned with a laser beam applied thereto through the sapphire substrate 11, similarly to EMBODIMENT 1. This decomposes the GaN layer 12. The laser beam used is a third-order harmonic (355 nm) of a Nd:YAG laser with an irradiation energy of 0.26 J/cm² and a pulse width of 5 ns. The diameter of the laser beam during scanning is 7 mm.

Since the wavelength of the absorption edge of GaN is 360 to 370 nm, the laser beam is transmitted by the sapphire substrate 11 to be absorbed by the GaN layer 12. As a result, the lower portion of the GaN layer 12 is heated and thermally decomposed. This forms a Ga metal portion 54 in the lower portion of the GaN layer 12 so that a nitrogen gas is emitted. At this time, the sapphire substrate 11 and the GaN layer 12 are not completely separated from each other even after irradiation with the laser beam and are weakly adhered to each other by the Ga metal portion 54. Since the GaN layer 12 is thin and difficult to handle, the subsequent steps are performed with the GaN layer 12 placed on the sapphire substrate 11.

Figure 5D:
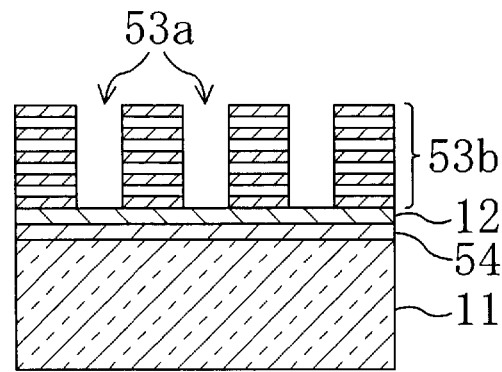

Next, in the step shown in FIG. 5D, the high reflectivity film 53 is patterned into a high reflectivity film 53b having openings 53a. The patterning of the high reflectivity film 53 is performed by photolithography or etching so that the striped openings 53a reaching the GaN layer 12 are formed. In the present embodiment, the width of each of the openings 53a is 3 μm and the spacing between the adjacent openings 53a is 3 μm. In the case of etching, a hydrofluoric acid and a hot concentrated sulfuric acid are used to etch the $SiO_2$ layers and the $TiO_2$ layers composing the high reflectivity film 53, respectively. The openings 53a may also have a dotted or rectangular configuration instead of a striped configuration. The present step may also be performed prior to the laser beam applying step. In that case, however, the GaN layer 12 positioned within the openings 53a may be split to fly off. To prevent this, the patterning is performed preferably after the laser beam applying step.

Figure 5E:
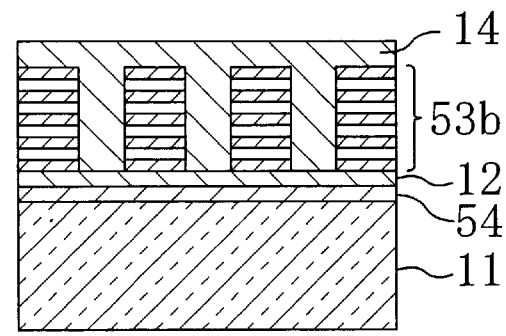

Next, in the step shown in FIG. 5E, a heat treatment is performed in a nitrogen and ammonia atmosphere at 800° C. for ten minutes to remove an impurity on the substrate surface therefrom, followed by the formation of the GaN layer 14 on the substrate. A method for forming the GaN layer 14 is the same as the method implemented in the step shown in FIG. 1B according to EMBODIMENT 1.

At this time, a GaN crystal does not grow on the high reflectivity film 53b but starts growing on the GaN layer 12 exposed in the openings 53a. As the GaN crystal continues growing, the GaN crystal which has started growing on the GaN layer 12 exposed in the openings 53a grows along the upper surface of the high reflectivity film 53b to eventually cover the high reflectivity film 53b in cooperation with the GaN crystal. Subsequently, a new GaN crystal grows on the GaN crystal covering the high reflectivity film 53b, whereby the GaN layer 14 is formed. Thus, the GaN layer 14 is grown to a thickness of 300 μm.

Figure 5F:
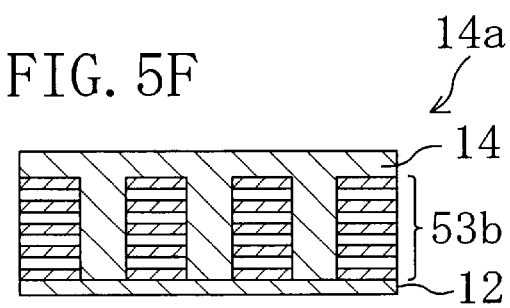

Next, in the step shown in FIG. 5F, the Ga metal portion 54 is removed by using a hydrochloric acid so that an independent GaN substrate 14a is obtained.

In the laser beam applying step shown in FIG. 5D according to the present embodiment, the laser beam which has not been absorbed by the lower portion of the GaN layer 12 is reflected back by the high reflectivity film 53 to contribute to the thermal decomposition of the GaN layer 12. If the intensity of the laser beam applied to the lower surface of the GaN layer 12 without being transmitted by the GaN layer 12 is assumed to be 1 and consideration is given to the penetration depth of the third-order harmonic of the laser beam in the GaN layer 12, which is about 0.3 μm, and to the reflectivity of the high reflectivity film 53, which is 97%, the intensity of the laser beam reflected back to the lower portion of the GaN layer 12 becomes about 0.13. In the present embodiment, therefore, the utilization of the irradiation energy of the laser beam contributing to the thermal decomposition of the GaN layer 12 becomes 1.13 times the utilization achieved in accordance with the conventional method. This allows efficient thermal decomposition of the GaN layer 12.

In contrast to the conventional method in which the threshold value of the irradiation energy of the laser beam for thermally decomposing the GaN layer 102 is about 0.30 J/cm², the irradiation energy of the laser beam in the present embodiment is 0.26 J/cm² but, nevertheless, the GaN layer 12 has been thermally decomposed. In other words, the present embodiment has achieved a reduction in the threshold value of the irradiation energy of the laser beam required to thermally decompose the GaN layer 12 to about 88% of the conventional threshold value.

Figure 6:
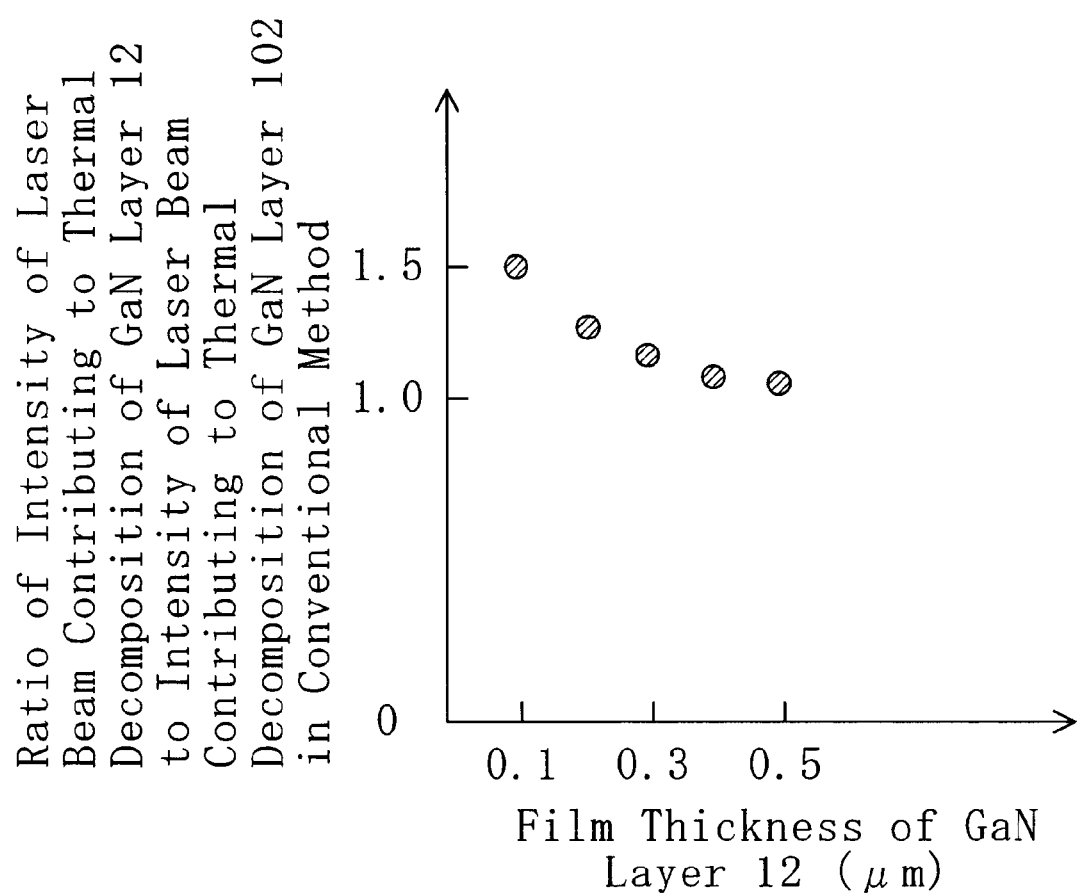
FIG. 6 shows the relationship between the thickness of a GaN layer and the intensity of a laser beam contributing to the thermal decomposition of the GaN layer 12.

The relationship between the thickness of the GaN layer 12 and the intensity of the laser beam contributing to the thermal decomposition of the GaN layer 12 in the present embodiment is shown in FIG. 6. The ordinate of FIG. 6 is expressed as a ratio of the intensity of the laser beam contributing to the thermal decomposition of the GaN layer 12 in the present embodiment to the intensity of the laser beam contributing to the thermal decomposition of the GaN layer 102 in the conventional method.

In the present embodiment, the intensity of the laser beam contributing to thermal decomposition is higher as the film thickness of the GaN layer 12 is smaller as shown in FIG. 6, which allows a reduction in the threshold value of the irradiation energy of the laser beam. If the GaN layer 12 is thinned excessively, however, the whole GaN layer 12 is thermally decomposed disadvantageously. Therefore, the film thickness of the GaN layer 12 should be adjusted to a degree which prevents thermal decomposition of the whole GaN layer 12.

As means for lowering the threshold value of the irradiation energy of the laser beam, the diameter of the laser beam can be increased. If the laser beam with a larger diameter is used, the number of scannings when the laser beam is applied can be reduced and the productivity and yield of the GaN substrate can be increased.

In addition, each of $SiO_2$ and $TiO_2$ composing the high reflectivity film 53 according to the present embodiment is a dielectric material having a thermal conductivity much lower than that of GaN, as described in EMBODIMENT 3. Accordingly, heat generated by the absorption of the laser beam by the GaN layer 12 is hard to conduct in the high reflectivity film 53. Consequently, heat diffused to the high reflectivity film 53 is small in amount and the majority of the generated heat contributes to the decomposition of the GaN layer 12 so that the GaN layer 12 is decomposed efficiently.

Moreover, the present embodiment has used the high reflectivity film 53b having the openings 53a and formed from the high reflectivity film 53 also as a mask for lateral growth of the GaN layer 14. This obviates the necessity to newly form a mask for lateral growth of the GaN layer 14 and reduces the number of fabrication process steps.

Embodiment 5

A method for fabricating a Group III nitride semiconductor substrate according to EMBODIMENT 5 of the present invention will be described with reference to FIGS. 7A to 7G, which are cross-sectional views illustrating the process steps of the fabrication method for a Group III nitride semiconductor substrate according to the present embodiment.

Figure 7A:
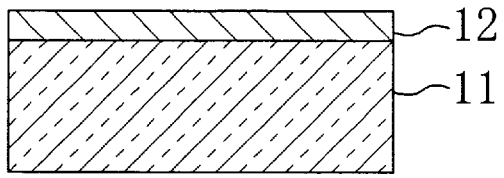
FIGS. 7A to 7G are cross-sectional views illustrating the process steps of a method for fabricating a Group III nitride semiconductor substrate according to EMBODIMENT 5 of the present invention.

First, in the step shown in FIG. 7A, a sapphire substrate 11 (with a diameter of 2 inches and a thickness of 300 μm) having a surface C as a principal surface is introduced into a MOVPE reactor. The sapphire substrate 11 is then thermally treated in a hydrogen atmosphere at 1050° C. and cooled to 500° C. Subsequently, a GaN buffer layer (not shown) with a thickness of 20 nm is formed on the sapphire substrate 11 by using trimethylgallium (TMG) as a Group III raw material, ammonia as a Group V raw material, and $H_2$ as a carrier gas. A GaN layer 12 with a thickness of 50 nm is formed on the GaN buffer layer by raising the temperature again to 1050° C.

Figure 7B:
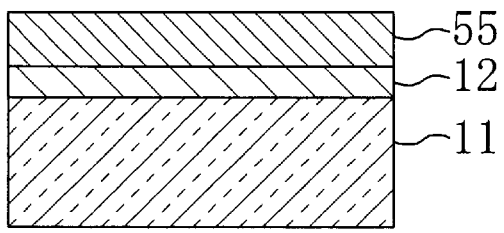

Next, in the step shown in FIG. 7B, an AlGaN layer 55 with a thickness of 4 μm is formed on the GaN layer 12 by using trimethylaluminum and trimethylgallium (TMG) as Group III raw materials, and ammonia as a Group V raw material.

Although the AlGaN layer 55 is formed from $Al_{0.1}Ga_{0.9}N$ in the present embodiment, the composition ratio between Al and Ga may be determined appropriately such that a band gap larger than the irradiation energy of the laser beam used in the laser beam applying step is provided. Thereafter, the substrate is cooled to a room temperature and retrieved from the MOVPE reactor.

Figure 7C:
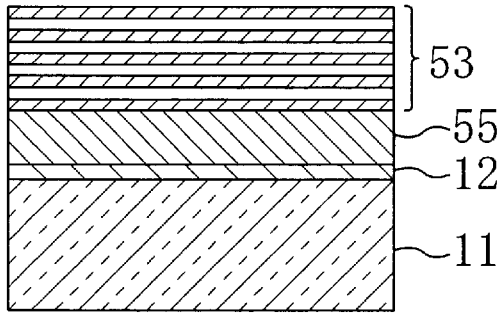

Next, in the step shown in FIG. 7C, $SiO_2$ layers each having a thickness of 61 nm and $TiO_2$ layers each having a thickness of 35 nm are formed alternately on the AlGaN layer 55 by sputtering, thereby forming a high reflectivity film 53. In the present embodiment, the high reflectivity film 53 is composed of the total of nine layers consisting of five $SiO_2$ layers and four $TiO_2$ layers. The reflectivity of the high reflectivity film 53 formed in the present embodiment against a third-order harmonic of a Nd:YAG laser beam is about 96%.

Figure 7D:
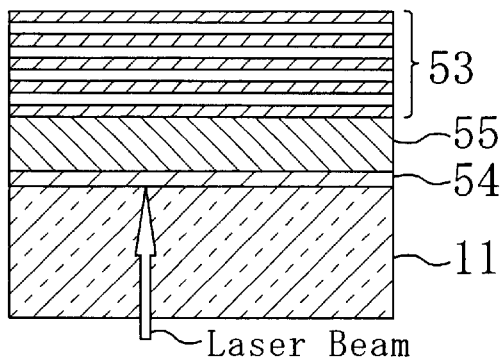

Next, in the step shown in FIG. 7D, the lower surface of the GaN layer 12 is entirely scanned with a laser beam applied thereto through the sapphire substrate 11, similarly to EMBODIMENT 1. This decomposes the GaN layer 12. The laser beam used is a third-order harmonic (355 nm) of a Nd:YAG laser with an irradiation energy of 0.20 J/cm$^2$ and a pulse width of 5 ns. The diameter of the laser beam during scanning is 7 mm.

Since the wavelength of the absorption edge of GaN is 360 to 370 nm, the laser beam is transmitted by the sapphire substrate 11 to be absorbed by the GaN layer 12. As a result, the lower portion of the GaN layer 12 is heated and thermally decomposed. Since the GaN layer 12 is extremely thin in the present embodiment, substantially the whole GaN layer 12 is changed into a Ga metal portion 54 so that a nitrogen gas is emitted. At this time, the sapphire substrate 11 and the AlGaN layer 55 are not completely separated from each other even after irradiation with the laser beam and are weakly adhered to each other by the Ga metal portion 54. Since the GaN layer 12 is thin and difficult to handle, the subsequent steps are performed with the AlGaN layer 55 placed on the sapphire substrate 11.

Figure 7E:
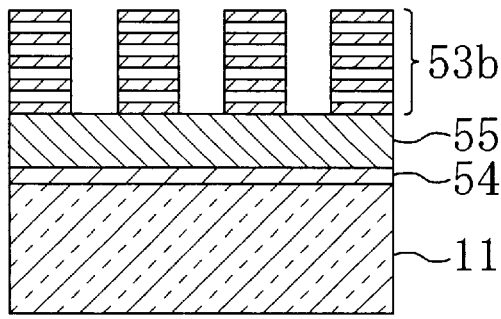

Next, in the step shown in FIG. 7E, the high reflectivity film 53 is patterned into a high reflectivity film 53b having openings 53a. The patterning of the high reflectivity film 53 is performed by photolithography or etching so that the striped openings 53a reaching the AlGaN layer 55 are formed. In the present embodiment, the width of each of the openings 53a is 3 μm and the spacing between the adjacent openings 53a is 3 μm. In the case of etching, a hydrofluoric acid and a hot concentrated sulfuric acid are used to etch the $SiO_2$ layers and the $TiO_2$ layers composing the high reflectivity film 53, respectively. The openings 53a may also have a dotted or rectangular configuration instead of a striped configuration. The present step may also be performed prior to the laser beam applying step. In that case, however, the GaN layer 12 positioned within the openings 53a may be split to fly off. To prevent this, the patterning is performed preferably after the laser beam applying step.

Figure 7F:
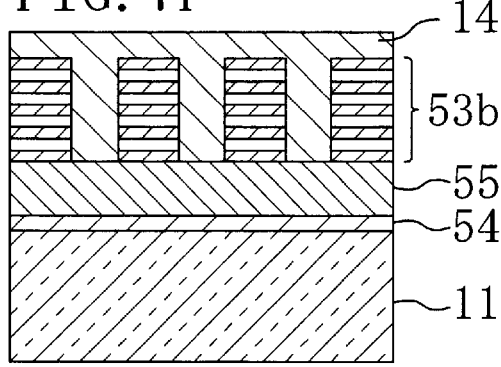

Next, in the step shown in FIG. 7F, a heat treatment is performed in a nitrogen and ammonia atmosphere at 800° C. for ten minutes to remove an impurity on the substrate surface therefrom, followed by the formation of the GaN layer 14 on the substrate. A method for forming the GaN layer 14 is the same as the method implemented in the step shown in FIG. 1B according to EMBODIMENT 1.

At this time, a GaN crystal does not grow on the high reflectivity film 53b but starts growing on the AlGaN layer 55 exposed in the openings 53a. As the GaN crystal continues growing, the GaN crystal which has started growing on the AlGaN layer 55 exposed in the openings 53a grows along the upper surface of the high reflectivity film 53b to eventually cover the high reflectivity film 53b in cooperation with the GaN crystal. Subsequently, a new GaN crystal grows on the GaN crystal covering the high reflectivity film 53b, whereby the GaN layer 14 is formed. Thus, the GaN layer 14 is grown to a thickness of 300 μm.

Figure 7G:
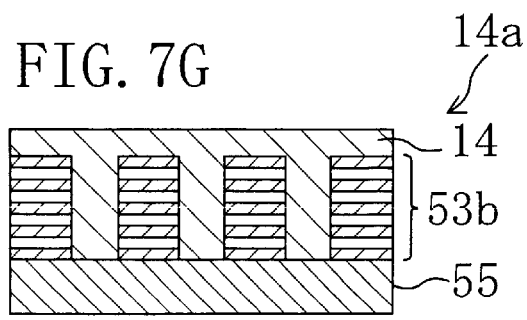

Next in the step shown in FIG. 7G, the sapphire substrate 11 having the AlGaN layer 55 and the GaN layer 14 mounted thereon is immersed in a hydrochloric acid so that the AlGaN layer 55 and the GaN layer 14 are separated from the sapphire substrate 11. What results is a Group III nitride semiconductor substrate composed of the AlGaN layer 55 and the GaN layer 14.

In the laser beam applying step shown in FIG. 7D according to the present embodiment, the laser beam which has not been absorbed by the lower portion of the GaN layer 12 is reflected back to the high reflectivity film 53 to contribute to the thermal decomposition of the GaN layer 12. Thus, the present embodiment allows the fabrication of a Group III nitride semiconductor substrate having a GaN layer 14 with an excellent crystalline property. The following is a detailed description of the mechanism.

A band gap in the AlGaN layer 55 ($Al_{0.1}Ga_{0.9}N$) is about 4.1 eV and larger than the energy of the third-order harmonic of the Nd:YAG laser beam. Accordingly, the laser beam is not absorbed by the AlGaN layer 55. The penetration depth of the laser beam in the GaN layer 12 is about 0.3 μm and the reflectivity of the high reflectivity film is 96%. If the foregoing conditions are considered and the intensity of the laser beam applied to the lower surface of the GaN layer 12 is assumed to be 1, the intensity of the laser beam reflected back by the high reflectivity film 53 to the lower surface of the GaN layer 12 becomes about 0.7. In the present embodiment, therefore, the utilization of the irradiation energy of the laser beam contributing to the thermal decomposition of the GaN layer 12 becomes 1.7 times the utilization achieved in accordance with the conventional method. This allows efficient thermal decomposition of the GaN layer 12.

In contrast to the conventional method in which the threshold value of the irradiation energy of the laser beam for thermally decomposing the GaN layer 102 is about 0.30 J/cm$^2$, the irradiation energy of the laser beam in the present embodiment is 0.20 J/cm$^2$ but, nevertheless, the GaN layer 12 has been thermally decomposed. In other words, the present embodiment has achieved a reduction in the threshold value of the irradiation energy of the laser beam required to thermally decompose the GaN layer 12 to about 67% of the conventional threshold value.

As means for lowering the threshold value of the irradiation energy of the laser beam, the diameter of the laser beam can be increased. If the laser beam with a larger diameter is used, the number of scannings when the laser beam is applied can be reduced. This provides a Group III nitride semiconductor substrate with an excellent crystalline property and also increases the productivity and yield of the Group III nitride semiconductor substrate.

In the present embodiment also, the intensity of the laser beam contributing to thermal decomposition is higher as the film thickness of the GaN layer 12 is smaller, similarly to EMBODIMENT 4 described above, which allows a reduction in the threshold value of the irradiation energy of the laser beam. If the GaN layer 12 is thinned excessively, however, the whole GaN layer 12 is thermally decomposed disadvantageously. Therefore, the film thickness of the GaN layer 12 should be adjusted to a degree which prevents thermal decomposition of the whole GaN layer 12.

Moreover, the present embodiment has used the high reflectivity film 53b having the openings 53a also as a mask for lateral growth of the GaN layer 22. This obviates the necessity to newly form a mask for lateral growth of the GaN layer 22 and reduces the number of fabrication process steps.

Embodiment 6

A method for fabricating a GaN substrate according to EMBODIMENT 6 of the present invention will be described with reference to FIGS. 5A to 8E, which are cross-sectional views illustrating the process steps of the fabrication method for the GaN substrate according to the present embodiment.

First, in the step shown in FIG. 5A, a double-side polished sapphire substrate 11 having a diameter of 2 inches, a thickness of 300 $\mu$m, and a surface C as a principal surface is prepared. Then, protons ($H^+$) are implanted into the sapphire substrate 11 from the lower surface thereof, as indicated by the arrows in the drawing. The conditions for implanting the protons are such that ion energy is 200 keV, a mean projected range is 1.12 $\mu$m, and a dose is $5.0 \times 10^6$ atoms $cm^{-2}$.

Figure 8A:
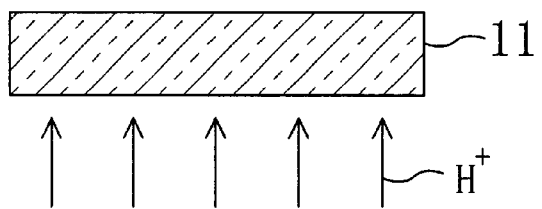
FIGS. 8A to 8E are cross-sectional views illustrating the process steps of a method for fabricating a GaN substrate according to EMBODIMENT 6 of the present invention.
Figure 8B:
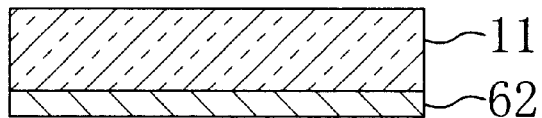

Next, in the step shown in FIG. 8B, an ion implanted region 62 having a thickness of about 2 $\mu$m and centering around a point at a depth of 1.12 $\mu$m from the lower surface of the sapphire substrate 11 is formed. Since the ion implanted region 62 is damaged during ion implantation, it contains numerous defects.

Figure 8C:
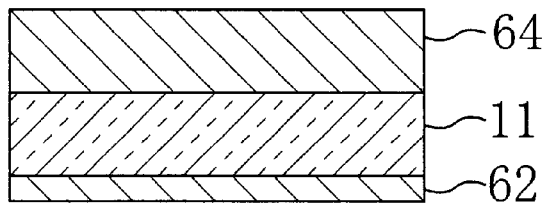

Next, in the step shown in FIG. 8C, the sapphire substrate 11 formed with the ion implanted region 62 is introduced into a HVPE reactor. Then, a GaN layer 64 is formed on the sapphire substrate 11 by supplying a GaCl from a Group III line and an ammonia gas together with a nitrogen carrier gas from a Group V line. Specifically, GaCl supplied from the Group III line is generated by introducing a HCl gas into a boat filled with Ga metal heated to 900° C. and using nitrogen as a carrier gas. This forms a buffer layer (not shown) composed of GaN and having a thickness of 30 nm on the upper surface of the sapphire substrate 11 heated to 500° C. Subsequently, the sapphire substrate 11 is heated to 1050° C. and the GaN layer 64 is grown at a rate of 50 $\mu$m/hour for six hours so that the GaN layer 64 eventually has a thickness of 300 $\mu$m. Thereafter, the substrate is cooled to a room temperature and retrieved from the HVPE reactor.

Figure 8D:
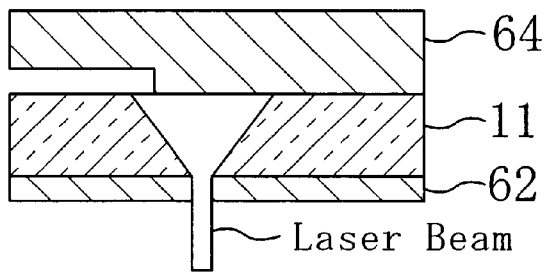

Next, in the step shown in FIG. 8D, the lower surface of the GaN layer 64 is entirely scanned with a laser beam applied thereto through the ion implanted region 62 and the sapphire substrate 11. This decomposes the GaN layer 12. The laser beam used is a third-order harmonic (355 nm) of a Nd:YAG laser with an irradiation energy of 0.3 $J/cm^2$ and a pulse width of 5 ns. The diameter of the beam during scanning is 1 mm.

During the application of the laser beam, the laser beam passes through the ion implanted region 62 containing numerous defects and hence lacking in crystal uniformity. Consequently, the laser beam that has passed through the ion implanted region 62 is scattered to have an increased diameter, as shown in FIG. 8D. This renders the spatial intensity distribution of the laser beam uniform. Since the wavelength of the absorption edge of GaN is 360 to 370 nm, the laser beam at a wavelength of 355 nm is absorbed by the GaN layer 64 so that heat is generated. The generated heat thermally decomposes the lower portion of the GaN layer 64.

Figure 8E:
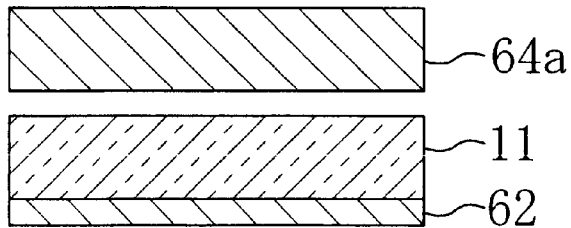

Next, in the step shown in FIG. 8E, the sapphire substrate 11 is separated from the GaN layer 64. Since the lower portion of the GaN layer 64 has been decomposed in the step shown in FIG. 5D, the sapphire substrate 11 can completely be separated from the GaN layer 64 so that an independent GaN layer 64, i.e., a GaN substrate 64a is obtained.

The substrate shown in FIG. 8C according to the present embodiment and another substrate formed in exactly the same manner as the substrate shown in FIG. 8C except that the ion implanted region 62 was not formed therein were prepared. A laser beam was applied to each of the respective lower surfaces of the two sapphire substrates for a period corresponding to only one pulse and the sizes of scars caused by irradiation were compared with each other. The applied laser beam had a diameter of 1 mm.

The scar observed in the GaN layer of the substrate unformed with the ion implanted region 62 had a circular configuration with a diameter of about 1 mm and the laser beam that had reached the GaN layer was hardly scattered. By contrast, the GaN layer 64 of the substrate formed with the ion implanted region 62 which is shown in FIG. 8C according to the present embodiment had a circular scar with a diameter of about 1.5 mm. This indicates that the laser beam applied to the substrate shown in FIG. 8C according to the present embodiment is scattered upon reaching the GaN layer 64 to have a diameter about 1.5 times larger than the diameter in the case where the ion implanted region 62 is not formed.

Thus, in accordance with the method for fabricating a GaN substrate of the present embodiment, the laser beam can be scattered effectively in the ion implanted region 62 formed in the sapphire substrate 11 to have a large diameter. This allows a reduction in the number of scannings with the laser beam and the fabrication of the GaN substrate in a shorter time.

Although the present embodiment has performed ion implantation with respect to the entire lower surface of the sapphire substrate, it is also possible to perform ion implantation with respect to part of the lower surface of the sapphire substrate.

The element implanted in the sapphire substrate 11 is not particularly limited. The same effects are achievable if B, Al, Ga, In, Si, Ge, Mg, Zn, N, O, C, or the like is implanted instead. It will easily be appreciated that a plurality of elements selected from the foregoing group may also be implanted.

Although the present embodiment has performed ion implantation prior to the growth of the GaN layer, ion implantation may be performed any time before the laser beam applying step.

If the crystalline property of the ion implanted region 62 recovers with the application of heat during the formation of the GaN layer 64, the scattering effect is lowered so that ion implantation is performed preferably to a degree which substantially prevents the recovery of a portion damaged by irradiation. Specific conditions for ion implantation cannot be limited since they differ depending on the element to be implanted. To ensure the scattering effect achieved by ion implantation, however, the dose is preferably within the range of $1 \times 10^{14}$ to $1 \times 10^{20}$ atoms $cm^{-2}$.

Since the lower portion of the resulting GaN substrate 64a has roughness as a result of thermal decomposition during the application of the laser beam, it may be planarized by polishing if necessary.

Embodiment 7

A method for fabricating a GaN substrate according to EMBODIMENT 7 of the present invention will be described with reference to FIGS. 9A to 9F, which are cross-sectional views illustrating the process steps of the fabrication method for the GaN substrate according to the present embodiment.

Figure 9A:
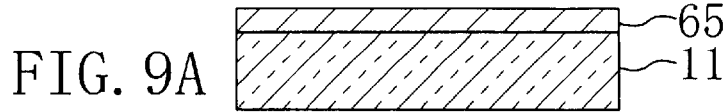
FIGS. 9A to 9F are cross-sectional views illustrating the process steps of a method for fabricating a GaN substrate according to EMBODIMENT 7 of the present invention.

First, in the step shown in FIG. 9A, a double-side polished sapphire substrate 11 having a diameter of 2 inches, a thickness of 300 μm, and a surface C as a principal surface is prepared and introduced into a HVPE reactor. Then, a GaN layer 65 is formed on the sapphire substrate 11 by supplying a GaCl from a Group III line and an ammonia gas together with a nitrogen carrier gas from a Group V line. Specifically, GaCl supplied from the Group III line is generated by introducing a HCl gas into a boat filled with Ga metal heated to 900° C. and using nitrogen as a carrier gas. This forms a buffer layer (not shown) composed of GaN and having a thickness of 30 nm on the upper surface of the sapphire substrate 11 heated to 500° C. Subsequently, the sapphire substrate 11 is heated to 1050° C. and the GaN layer 65 is grown at a rate of 50 μm/hour for about two minutes so that the GaN layer 65 eventually has a thickness of 1 μm. Thereafter, the substrate is cooled to a room temperature and retrieved from the HVPE reactor.

Figure 9B:
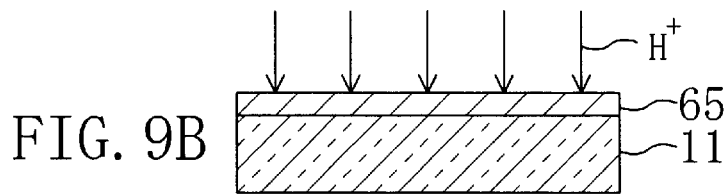

Next, in the step shown in FIG. 9B, protons ($H^+$) are implanted into the GaN layer 65, as indicated by the arrows in the drawing. The conditions for implanting ions (protons) are such that ion energy is 180 keV, a mean projected range is 1.12 μm, and a dose is $5.0 \times 10^{16}$ atoms $cm^{-2}$.

Figure 9C:
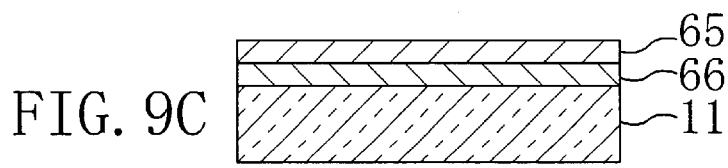

Next, in the step shown in FIG. 9C, an ion implanted region 66 having a thickness of about 0.5 μm is formed in the upper portion of the sapphire substrate 11. Since the ion implanted region 66 is damaged during ion implantation, it contains numerous defects.

Figure 9D:
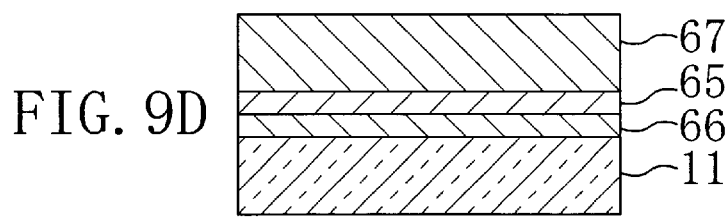

Next, in the step shown in FIG. 9D, the substrate is introduced again into the HVPE reactor and a heat treatment is performed in an ammonia atmosphere at 700° C. to remove an impurity on an surface of the GaN layer 65 therefrom. Then, the sapphire substrate 11 is heated to 1050° C. and a GaN layer 67 is grown at a rate of 50 μm/hour for six hours to a thickness of 300 μm. Thereafter, the substrate is cooled to a room temperature and retrieved from the HVPE reactor.

Figure 9E:
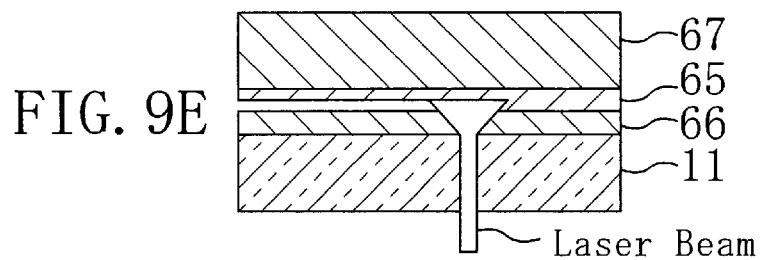

Next, in the step shown in FIG. 9E, the lower surface of the GaN layer 65 is entirely scanned with a laser beam applied thereto through the sapphire substrate 11 and the ion implanted region 66. This decomposes the lower portion of the GaN layer 65. The laser beam used is a third-order harmonic (355 nm) of a Nd:YAG laser with an irradiation energy of 0.3 $J/cm^2$ and a pulse width of 5 ns. The diameter of the beam during scanning is 1 mm.

During the application of the laser beam, the laser beam passes through the ion implanted region 66 containing numerous defects and hence lacking in crystal uniformity. Consequently, the laser beam that has passed through the ion implanted region 66 is scattered to have an increased diameter, as shown in FIG. 9E. This renders the spatial intensity distribution of the laser beam uniform. Since the wavelength of the absorption edge of GaN is 360 to 370 nm, the laser beam at a wavelength of 355 nm is absorbed by the GaN layer 65 so that heat is generated. The generated heat thermally decomposes the lower portion of the GaN layer 65.

Figure 9F:
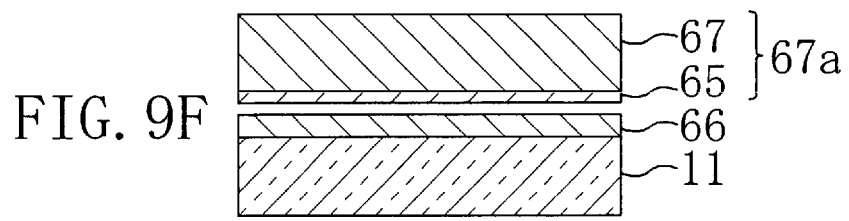

Next, in the step shown in FIG. 9F, the sapphire substrate 11 including the ion implanted region 66 is separated from the GaN layers 65 and 67. Since the lower portion of the GaN layer 65 has been decomposed in the step shown in FIG. 9E, the sapphire substrate 11 can completely be separated from the GaN layer 65 so that independent GaN layers 65 and 67, i.e., a GaN substrate 67a is obtained.

After the step shown in FIG. 9F, the lower portion of the resulting GaN substrate 67a having roughness as a result of thermal decomposition during the application of the laser beam may be planarized by polishing if necessary.

The substrate shown in FIG. 9D according to the present embodiment and another substrate formed in exactly the same manner as the substrate shown in FIG. 9D except that the ion implanted region 66 was not formed therein were prepared. A laser beam was applied to each of the respective lower surfaces of the two sapphire substrates for a period corresponding to only one pulse and the sizes of scars caused by irradiation were compared with each other. The applied laser beam had a diameter of 1 mm.

The scar observed in the GaN layer of the substrate unformed with the ion implanted region 66 had a circular configuration with a diameter of about 1 mm and the laser beam that had reached the GaN layer was hardly scattered. By contrast, the GaN layer 65 of the substrate formed with the ion implanted region 66 which is shown in FIG. 9D according to the present embodiment had a circular scar with a diameter of about 1.3 mm. This indicates that the laser beam applied to the substrate shown in FIG. 9D according to the present embodiment is scattered upon reaching the GaN layer 65 to have a diameter about 1.3 times larger than the diameter in the case where the ion implanted region 66 is not formed.

Thus, in accordance with the method for fabricating a GaN substrate of the present embodiment, the laser beam can be scattered effectively in the ion implanted region 66 formed in the sapphire substrate 11 to have a large diameter. This allows a reduction in the number of scannings with the laser beam and the fabrication of the GaN substrate in a shorter time.

Although the present embodiment has performed ion implantation with respect to the entire upper surface of the sapphire substrate, it is also possible to perform ion implantation with respect to part of the upper surface the sapphire substrate.

The element implanted in the sapphire substrate 11 is not particularly limited. The same effects are achievable if B, Al, Ga, In, Si, Ge, Mg, Zn, N, C, or the like is implanted instead. It will easily be appreciated that a plurality of elements selected from the foregoing group may also be implanted.

As described above, the present embodiment has performed ion implantation through the GaN layer 65. To reduce damage to the GaN layer 65, a dose is adjusted preferably to $1.0 \times 10^{14}$ to $1.0 \times 10^{18}$ atoms $cm^{-2}$ such that it is lower than in EMBODIMENT 6 in which ions are implanted directly into the substrate.

If the GaN layer 65 contains a portion which has been thermally decomposed and a portion which has not been thermally decomposed as a result of the application of the laser beam, a localized stress is produced in the GaN layer 65. However, since the present embodiment has performed ion implantation through the GaN layer 65, the GaN layer 65 also has a portion damaged by ion implantation where an interatomic bond is weaker than in the other portion. Accordingly, the localized stress produced in the GaN layer 65 is reduced by the portion with a weaker interatomic bond. As a result, a crack or fracture is less likely to occur in the GaN layer 65 so that a high-quality GaN substrate with a smaller number of cracks or factures is obtained.

Embodiment 8

A method for fabricating a GaN substrate according to EMBODIMENT 8 of the present invention will be described with reference to FIGS. 10A to 10G.

Figure 10A:
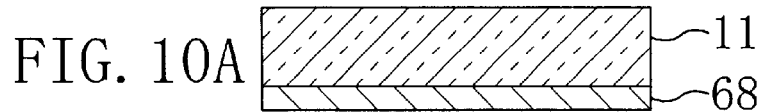
FIGS. 10A to 10G are cross-sectional views illustrating the process steps of a method for fabricating a GaN substrate according to EMBODIMENT 8 of the present invention.

First, in the step shown in FIG. 10A, a double-side polished sapphire substrate 11 having a diameter of 2 inches, a thickness of 300 μm, and a surface C as a principal surface is prepared and introduced into a HVPE reactor. Then, a Ni layer 68 with a thickness of 100 nm is formed by vapor deposition on the lower surface of the sapphire substrate 11.

Figure 10B:
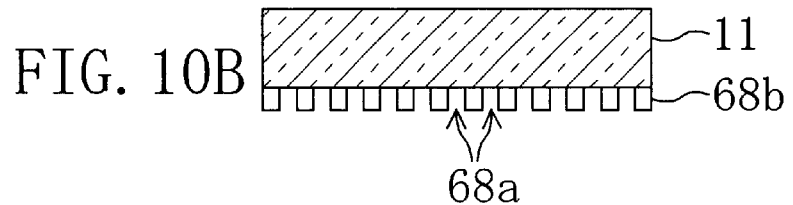

Next, in the step shown in FIG. 10B, the Ni layer 68 is patterned into a Ni film 68b having openings 68a. The patterning of the Ni film 68 is performed by photolithography or etching so that the striped openings 68a reaching the sapphire substrate 11 are formed. In the present embodiment, the width of each of the openings 68a is 0.25 μm and the spacing between the adjacent openings 68a is 0.25 μm. The openings are provided to extend in the <11-20> direction of the sapphire substrate 11.

Figure 10C:
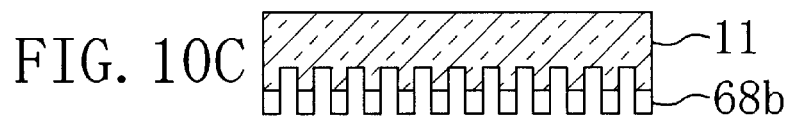

Next in the step shown in FIG. 10C, the sapphire substrate 11 masked with the Ni film 68b is etched by dry etching using an Ar gas.

Figure 10D:
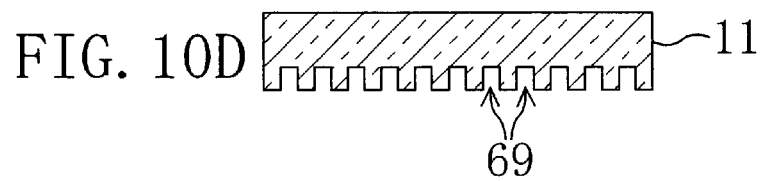

Next, in the step shown in FIG. 10D, the Ni film 68b is removed by wet etching, whereby trenches 69 are formed in the lower portion of the sapphire substrate 11. In the present embodiment, the depth of each of the trenches 69 is 0.25 μm.

Figure 10E:
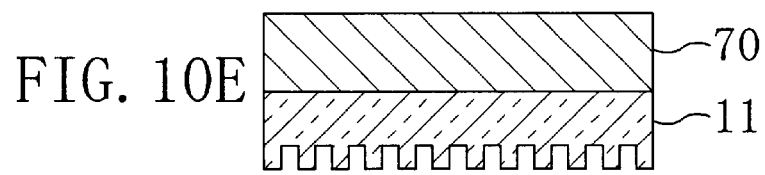

Next, in the step shown in FIG. 10E, a GaN layer 70 with a thickness of 30 μm is formed on the upper surface of the sapphire substrate 11 in the same manner as in EMBODIMENT 6. Subsequently, the substrate is cooled to a room temperature.

Figure 10F:
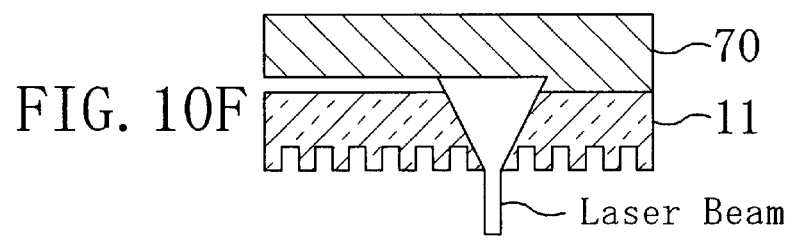

Next, in the step shown in FIG. 10F, the lower surface of the GaN layer 70 is entirely scanned with a laser beam applied thereto through the sapphire substrate 11. This decomposes the lower portion of the GaN layer 70. The laser beam used is a third-order harmonic (355 nm) of a laser with an irradiation energy of 0.3 J/cm$^2$ and a pulse width of 5 ns. The diameter of the beam during scanning is 1 mm.

During the application of the laser beam, the laser beam is scattered by the trenches 69 to have an increased diameter, as shown in FIG. 10F. This renders the spatial intensity distribution of the laser beam uniform. Since the wavelength of the absorption edge of GaN is 360 to 370 nm, the laser beam at a wavelength of 355 nm is absorbed by the GaN layer 70 so that heat is generated. The generated heat thermally decomposes the lower portion of the GaN layer 70.

Figure 10G:
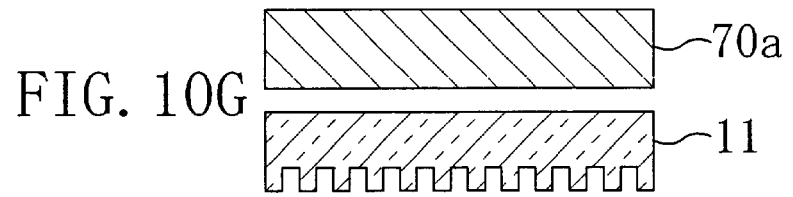
Figure 11A:
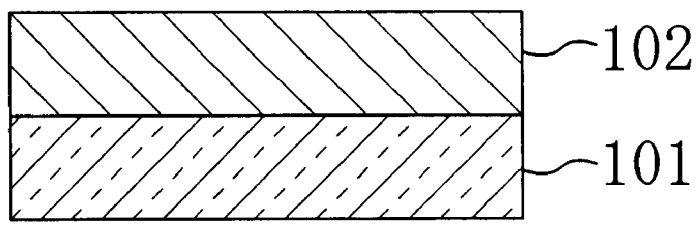
FIGS. 11A to 11C are cross-sectional views illustrating the process steps of a conventional method for fabricating a GaN substrate.
Figure 11B:
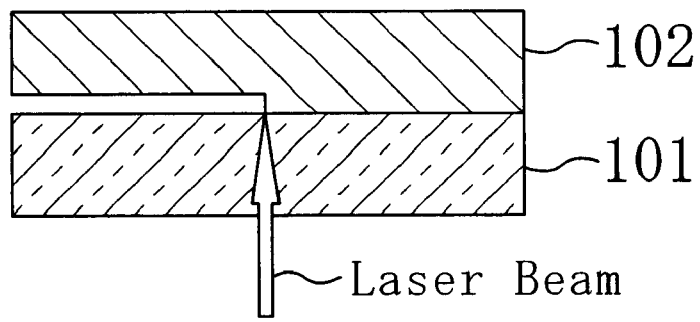
Figure 11C:
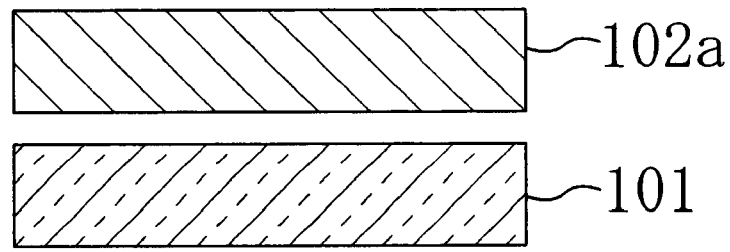

Next, in the step shown in FIG. 10G, the sapphire substrate 11 is separated from the GaN layer 70. Since the lower portion of the GaN layer 70 has been decomposed in the step shown in FIG. 10F, the sapphire substrate 11 can completely be separated from the GaN layer 70 so that an independent GaN layer 70, i.e., a GaN substrate 70a is obtained.

The substrate shown in FIG. 10E according to the present embodiment and another substrate formed in exactly the same manner as the substrate shown in FIG. 10E except that the trenches 69 were not formed therein were prepared. A laser beam was applied to each of the respective lower surfaces of the two sapphire substrates for a period corresponding to only one pulse and the sizes of scars caused by irradiation were compared with each other. The applied laser beam had a diameter of 1 mm.

The scar observed in the GaN layer of the substrate unformed with the trenches 69 had a circular configuration with a diameter of about 1 mm and the laser beam that has reached the GaN layer was hardly scattered. By contrast, the GaN layer 70 of the substrate formed with the trenches 69 according to the present embodiment, which is shown in FIG. 10E, had a circular scar with a diameter of about 1.5 mm. This indicates that the laser beam applied to the substrate shown in FIG. 10E according to the present embodiment is scattered upon reaching the GaN layer 70 to have a diameter of about 1.5 times larger than the diameter in the case where the trenches 69 are not formed.

Thus, in accordance with the method for fabricating a GaN substrate of the present embodiment, the laser beam can be scattered effectively by the trenches 69 formed in the sapphire substrate 11 to have a large diameter. This allows a reduction in the number of scannings with the laser beam and the fabrication of the GaN substrate in a shorter time.

Although the present embodiment has formed the striped trenches 69, it is not limited thereto. Instead of the trenches 69, depressed portions may also be provided in a dotted or grid configuration. Alternatively, irregular depressed portions formed by sandblasting or cutting may also be provided instead.

Preferably, the trenches 69 or the foregoing depressed portions are formed more densely because, as the density thereof is higher, the scattering effect is higher. To achieve the scattering effect in the present embodiment, the width of each of the trenches 69 and the spacing therebetween is preferably equal to or smaller than the wavelength of incident light. The trenches 69 may also have inclined side surfaces. As an example of a method for forming the trenches 69 having inclined side surfaces, there can be listed one which obliquely applies a plasma to the lower surface of the sapphire substrate 11 or one which uses a mask material (e.g., a resist) easily grated by etching as a mask used in the step of etching the sapphire substrate 11 shown in FIG. 10C.

Embodiment 9

The present embodiment will describe a method for fabricating a large number of GaN substrates by using any one of the GaN substrates 14a, 64a, 67a, and 70a according to EMBODIMENTS 1 to 8.

For example, the GaN substrate 14a having a diameter of 2 inches is introduced into a HVPE reactor. The GaN substrate 14a is thermally treated in an ammonia atmosphere at 750° C. and then heated to 1050° C., similarly to EMBODIMENT 1, to be grown to a thickness of 10 mm. Thereafter, the substrate is cooled to a room temperature and retrieved from the HVPE reactor. Subsequently, the substrate is sliced with a slicer orthogonally to the axis c such that each of the slices has a thickness of 300 μm, whereby thirty GaN substrates are formed.

It will easily be appreciated that a plurality of GaN substrate can also be fabricated by using any of the GaN substrates 14a, 64a, 67a, and 70a obtained in EMBODIMENTS 2 to 8 in exactly the same manner as described above.

The method according to the present embodiment allows a plurality of GaN substrates to be fabricated simultaneously since it grows a GaN single crystal to a large thickness by using, as a seed crystal, the GaN substrate fabricated in any of EMBODIMENTS 1 to 8 and slices the thick GaN single crystal with a slicer. In addition, the method according to the present embodiment allows fabrication at lower cost since it uses only one sapphire substrate 11, which is used initially in each of EMBODIMENTS 1 to 8.

Other Embodiments

The present embodiment will describe variations of EMBODIMENTS 1 to 8.

Although each of EMBODIMENTS 1 to 8 has described the method for fabricating a GaN substrate as examples of the method for fabricating a Group III nitride semiconductor substrate, the present invention is not limited thereto. By properly changing a raw material gas supplied from the Group III line, a Group III nitride semiconductor substrate composed of $Al_xGa_yIn_{1-x-y}N$ ($0 \leq x \leq 1$, $0 \leq y \leq 1$, $0 \leq x+y \leq 1$) can be fabricated.

Although each of EMBODIMENTS 1 to 8 has used the Nd:YAG laser beam, any laser beam may be used provided that it has a wavelength larger than the wavelength of the absorption edge of a group III nitride semiconductor substrate and smaller than the wavelength of the absorption edge of the substrate. For example, a KrF: excimer laser beam (248 nm), XeCl: excimer laser beam (308 nm), or the like may also be used instead.

Although each of EMBODIMENTS 1 to 8 has used the sapphire substrate 11 of a size of 2 inches, a Group III nitride semiconductor substrate having a larger area and free from a fracture or a chip can also be fabricated.

Instead of the sapphire substrate 11, a material (such as spinel) capable of transmitting a Nd:YAG laser beam and a KrF excimer laser beam may also be used.

In forming a Group III nitride semiconductor substrate, it may also be doped with a Group II, Group IV, or Group VI element by using a raw material containing the Group II, Group IV, or Group VI element. If a GaN substrate is doped with Si, Ge, Se, or the like as an impurity, a Group III nitride semiconductor film of n-type conductivity type can be obtained. If a GaN substrate is doped with Be, Mg, Zn, or the like as an impurity, a Group III nitride semiconductor film of p-type conductivity type can be obtained.

Thus, the method for fabricating a Group III nitride semiconductor substrate according to the present invention allows shorter-time fabrication of a Group III nitride semiconductor substrate having a large area and free from a fracture or a chip and thereby allows mass production of Group III nitride semiconductor substrates.

The method for fabricating a nitride semiconductor substrate according to the present invention allows a reduction in the threshold value of the irradiation energy of a laser beam required to thermally decompose a nitride semiconductor layer. The reduced threshold value allows an increase in the diameter of the laser beam and thereby achieves a reduction in the number of scannings with a laser beam required to separate a mother substrate from a nitride semiconductor layer. This reduces the time required to perform a laser beam applying step and improves productivity. The reduced number of scannings with the laser beam leads to an improved yield.

Each of the Group III nitride semiconductor substrates obtained in the individual embodiments of the present invention is used to fabricate a semiconductor device such as a semiconductor laser or a field-effect transistor.

What is claimed is:

1. A method for fabricating a Group III nitride semiconductor substrate, the method comprising the steps of:
   (a) preparing a substrate;
   (b) forming, on the substrate, a first semiconductor layer composed of a Group III nitride semiconductor;
   (c) forming, on the first semiconductor layer, a heat diffusion suppressing layer lower in thermal conductivity than the first semiconductor layer;
   (d) forming, on the heat diffusion suppressing layer, a second semiconductor layer composed of a Group III nitride semiconductor; and
   (e) irradiating the first semiconductor layer through the substrate with a light beam transmitted by the substrate and absorbed by the first semiconductor layer to decompose the first semiconductor layer.

2. The method of claim 1, wherein the Group III nitride semiconductor composing the heat diffusion suppressing layer is lower in thermal conductivity than the Group III nitride semiconductor composing the first semiconductor layer.

3. The method of claim 2, wherein the heat diffusion suppressing layer is composed of a semiconductor represented by $In_xGa_{1-x}N$ ($0<x\leq1$).

4. The method of claim 1, wherein the step (c) includes forming the heat diffusion suppressing layer and then forming an opening extending through the heat diffusion suppressing layer and reaching the first semiconductor layer.

5. The method of claim 4, wherein the heat diffusion suppressing layer is composed of a metal.

6. The method of claim 5, wherein the heat diffusion suppressing layer is composed of at least one metal selected from the group consisting of Ni, Pt, and Ti.

7. The method of claim 4, wherein the heat diffusion suppressing layer is composed of a dielectric material.

8. The method of claim 7, wherein the heat diffusion suppressing layer is composed of at least one dielectric material selected from the group consisting of a silicon dioxide film and a silicon nitride film.

9. The method of claim 1, further comprising, after the step (e), the step of:
   (f) removing the heat diffusion suppressing layer.

10. The method of claim 9, wherein the step (f) includes removing the heat diffusion suppressing layer by etching.

11. The method of claim 9, wherein the step (f) includes removing the heat diffusion suppressing layer by polishing.

12. The method of claim 1, wherein the substrate is lower in thermal conductivity than the group III nitride semiconductor composing the first semiconductor layer.

13. A method for fabricating a Group III nitride semiconductor substrate, the method comprising the steps of:
   (a) preparing a substrate;
   (b) forming, on the substrate, a first semiconductor layer composed of a Group III nitride semiconductor;
   (c) forming, on the first semiconductor layer, a light reflecting layer;
   (d) forming, on the light reflecting layer, a second semiconductor layer composed of a Group III nitride semiconductor; and
   (e) irradiating the first semiconductor layer through the substrate with a light beam transmitted by the substrate and absorbed by the first semiconductor layer to decompose the first semiconductor layer,
   the light reflecting layer reflecting the light beam applied in the step (e).

14. The method of claim 13, wherein the first semiconductor layer has a first layer composed of a Group III nitride semiconductor having a band gap smaller than energy of the light beam and a second layer composed of a Group III nitride semiconductor having a band gap larger than the energy of the light beam, the second layer being formed on the first layer.

15. The method of claim 13, wherein the step (c) includes forming the light reflecting layer and then forming an opening extending through the light reflecting layer and reaching the first semiconductor layer.

16. The method of claim 15, wherein the light reflecting layer is composed of a dielectric material.

17. The method of claim 16, wherein the light reflecting layer is a multilayer film composed of silicon dioxide films and titanium oxide films which are alternately stacked in layers.

18. A method for fabricating a Group III nitride semiconductor substrate, the method comprising the steps of:
   (a) preparing a substrate;
   (b) forming a light scattering portion within the substrate;
   (c) forming, on the substrate, a semiconductor layer composed of a Group III nitride semiconductor; and (d) irradiating the semiconductor layer through the substrate with a light beam transmitted by the substrate and absorbed by the semiconductor layer to decompose a lower portion of the semiconductor layer.

19. The method of claim 18, wherein the step (b) includes implanting ions into the substrate to form the light scattering portion within the substrate.

20. The method of claim 19, wherein the step (c) is performed after the step (a) and the step (b) includes implanting the ions into the substrate through the semiconductor layer to form the light scattering portion within the substrate, the method further comprising, between the steps (b) and (d), the step of:

forming, on the semiconductor layer, another semiconductor layer composed of a Group III nitride semiconductor.

21. The method of claim 18, wherein the step (b) includes forming, as the light scattering portion, a plurality of depressed portions in a lower portion of the substrate.

22. The method of claim 21, wherein the plurality of depressed portions are formed with application of a plasma.

* * * * *